US012663718B2

(12) United States Patent
Nishimaki et al.

(10) Patent No.: US 12,663,718 B2
(45) Date of Patent: Jun. 23, 2026

(54) RESIST UNDERLAYER FILM-FORMING COMPOSITION

(71) Applicant: NISSAN CHEMICAL CORPORATION, Tokyo (JP)

(72) Inventors: Hirokazu Nishimaki, Toyama (JP); Makoto Nakajima, Toyama (JP); Keisuke Hashimoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 608 days.

(21) Appl. No.: 17/261,253

(22) PCT Filed: Jul. 19, 2019

(86) PCT No.: PCT/JP2019/028414

§ 371 (c)(1),
(2) Date: Jan. 19, 2021

(87) PCT Pub. No.: WO2020/017626

PCT Pub. Date: Jan. 23, 2020

(65) Prior Publication Data

US 2021/0271169 A1 Sep. 2, 2021

(30) Foreign Application Priority Data

Jul. 20, 2018 (JP) ................................. 2018-137157

(51) Int. Cl.

| | |
|---|---|
| ***G03F 7/11*** | (2006.01) |
| ***C08G 8/04*** | (2006.01) |
| ***C08G 12/08*** | (2006.01) |
| ***C08G 12/26*** | (2006.01) |
| ***H10P 76/20*** | (2026.01) |

(52) U.S. Cl.

CPC .................. *G03F 7/11* (2013.01); *C08G 8/04* (2013.01); *C08G 12/08* (2013.01); *C08G 12/26* (2013.01); *H10P 76/2041* (2026.01)

(58) Field of Classification Search

CPC .. G03F 7/11; G03F 7/094; C08G 8/04; C08G 12/08; C08G 12/26; H01L 21/0274; H10P 76/2041

See application file for complete search history.

(56) References Cited

U.S. PATENT DOCUMENTS 5,223,602 A * 6/1993 Kaji ...................... C08G 18/64 528/214
2014/0235059 A1* 8/2014 Sakamoto ............ C09D 179/04 528/269
2015/0044876 A1* 2/2015 Nishimaki ............ G03F 7/2037 525/509
2015/0212418 A1* 7/2015 Nishimaki ........... C09D 161/12 524/594
2016/0060384 A1* 3/2016 Nakamura ............... H05K 1/09 428/209
2016/0347965 A1* 12/2016 Umezaki ................ C08L 33/14
2017/0097568 A1* 4/2017 Endo .......................... G03F 7/11
2017/0199457 A1* 7/2017 Hatakeyama ....... H01L 21/0332
2017/0227850 A1* 8/2017 Nishimaki .............. G03F 7/325
2019/0294046 A1* 9/2019 Nishimaki ............ H01L 21/027

FOREIGN PATENT DOCUMENTS

JP 2005-114921 A 4/2005
JP 2017-125890 A 7/2017
WO 2014/185335 A1 11/2014
WO 2015/151803 A1 10/2015
WO WO-2016021594 A1 * 2/2016 ............ C08G 12/26
WO 2017/199768 A1 11/2017

OTHER PUBLICATIONS https://www.tcichemicals.com/US/en/p/B2664 (Year: 2024).*
https://www.accustandard.com/prod0013677.html (Year: 2025).*
Oct. 8, 2019 International Search Report issued in International Patent Application No. PCT/JP2019/028414.

* cited by examiner

*Primary Examiner* — Jonathan Johnson
*Assistant Examiner* — Alexander N. Lee
(74) *Attorney, Agent, or Firm* — Oliff PLC

(57) ABSTRACT

The composition of the present invention contains a polymer to which there is attached a group represented by the following formula (1):

(1)

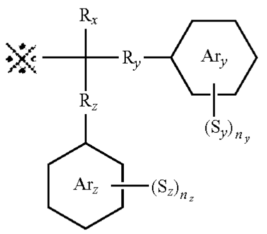

(wherein each of $R_x$, $S_y$, and $S_z$ represents a hydrogen atom or a monovalent organic group; each of $R_y$ and $R_z$ represents a single bond or a divalent organic group; each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween; $n_y$ is an integer of 0 to the maximum number corresponding to allowable substitution to ring $Ar_y$; $n_z$ is an integer of 0 to the maximum number corresponding to allowable substitution to ring $Ar_z$; and * is a polymer bonding site).

8 Claims, No Drawings

RESIST UNDERLAYER FILM-FORMING COMPOSITION

TECHNICAL FIELD

The present invention relates to a composition for forming a resist underlayer film (hereinafter referred to as a "resist underlayer film-forming composition"), and the like.

BACKGROUND ART

In a multi-layer resist process, a stacked body in which inorganic layers and organic layers are alternatingly stacked (e.g., a stacked body including a semiconductor substrate, a resist underlayer film, a hard mask, and a photoresist film) is subjected to etching by alternatingly using etching gases having different etching selectivities to the inorganic layers and the organic layers, to thereby pattern the substrate. Patent Document 1 discloses a resist underlayer film-forming composition for use in the multi-layer resist process containing at least a novolak resin, wherein the novolak resin is formed from a unit having a specific substituent.

PRIOR ART DOCUMENTS

Patent Documents

Patent Document 1: Japanese Patent Application Laid-Open (kokai) No. 2005-114921

SUMMARY OF THE INVENTION

Problems to be Solved by the Invention

In order to suitably carry out the multi-layer resist process, the resist underlayer film is required to have characteristics, such as, insolubility in a photoresist solution (i.e., a solution for forming a photoresist film) and high etching selectivity, and the resist underlayer film-forming composition is required to have characteristics, such as, high solubility of a constituent polymer in the solvent of the composition.

Thus, an object of the present invention is to provide a resist underlayer film-forming composition which can form a resist underlayer film insoluble in a photoresist solution and having high etching selectivity and which contains a polymer having excellent solubility in a solvent of the resist underlayer film-forming composition. Another object is provision of a method for producing the resist underlayer film-forming composition (hereinafter may be referred to as a "resist underlayer film-forming composition production method"). Other objects of the present invention include provision of a resist underlayer film and a method for producing the film, a patterned substrate and a method for producing the substrate, and a method for producing a semiconductor device, which can be achieved by use of the resist underlayer film-forming composition.

Means for Solving the Problems

In a first mode of the present invention for attaining the above objects, there is provided a resist underlayer film-forming composition containing a polymer to which there is attached a group represented by the following formula (1):

(1)

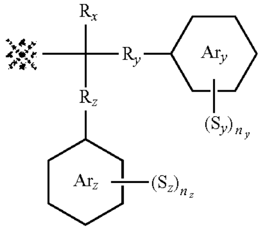

(wherein each of $R_x$, $S_y$, and $S_z$ represents a hydrogen atom or a monovalent organic group; each of $R_y$ and $R_z$ represents a single bond or a divalent organic group; each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween; $n_y$ is an integer of 0 to the maximum number corresponding to allowable substitution to ring $Ar_y$; $n_z$ is an integer of 0 to the maximum number corresponding to allowable substitution to ring $Ar_z$; and * is a polymer bonding site).

A second mode of the present invention is a specific embodiment of the resist underlayer film-forming composition of the first mode, wherein at least one of ring $Ar_y$ and ring $Ar_z$ includes a C6 to C30 aryl group.

A third mode of the present invention is a specific embodiment of the resist underlayer film-forming composition of the first or second mode, wherein the group represented by formula (1) is at least one group selected from among the following formulas (1-1) to (1-15):

[F2]

(1-1)

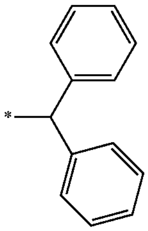

(1-2)

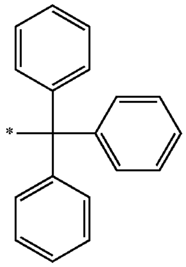

(1-3)

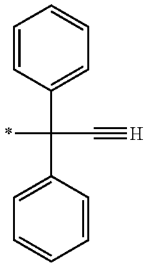

-continued
(1-4)
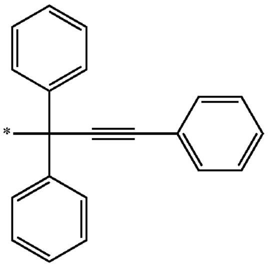
(1-5)
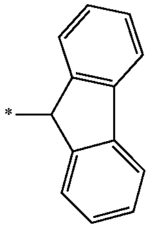
(1-6)
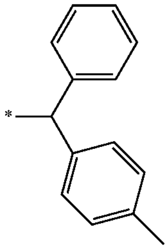
(1-7)
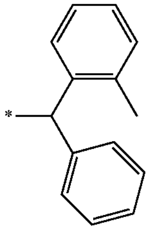
(1-8)
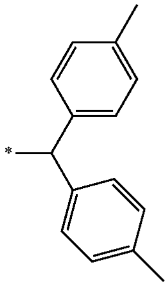
(1-9)
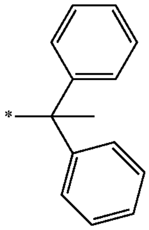
-continued
(1-10)
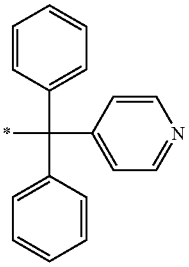
(1-11)
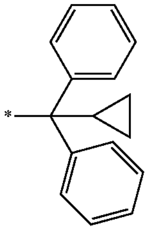
(1-12)
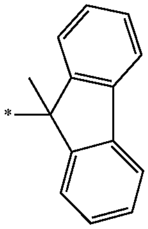
(1-13)
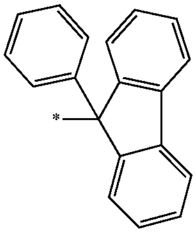
(1-14)
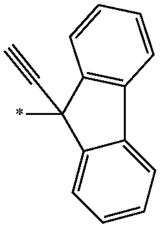
(1-15)
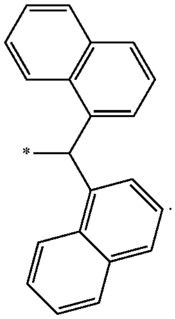
(wherein * is a polymer bonding site)
A fourth mode of the present invention is a specific embodiment of the resist underlayer film-forming composition of any one of the first to third modes, wherein the polymer includes at least one of a unit represented by the following formula (1a) and a unit represented by the following formula (1b):

[F3]

(1a)

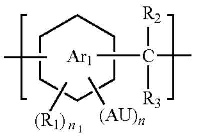

(1b)

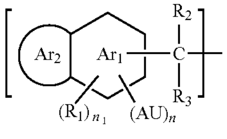

(wherein each of AU represents a group represented by formula (1); each of $R_1$ represents a halogen group, a nitro group, an amino group, a hydroxyl group, a glycidyl ether group, an aromatic hydrocarbyl group, a C1 to C10 alkyl group, or a C2 to C10 alkenyl group and may include at least one of an ether group, a ketone group, and an ester group; each of $R_2$ represents a hydrogen atom, an aromatic hydrocarbyl group, or a heterocyclic group; each of $R_3$ represents a hydrogen atom, an aromatic hydrocarbyl group, a heterocyclic group, a C1 to C10 alkyl group, or a C2 to C10 alkenyl group; each of the aromatic hydrocarbyl group and the heterocyclic group of $R_2$ and $R_3$ may have at least one substituent selected from among a halogen group, a nitro group, an amino group, a formyl group, a carboxyl group, an alkyl carboxylate ester group, a hydroxyl group, a C1 to C10 alkyl group, a C1 to C10 alkoxy group, and a C6 to C40 aryl group; $R_2$ and $R_3$ may be linked together to form a ring structure; each of ring $Ar_1$ represents a benzene ring, a naphthalene ring, or an anthracene ring; ring $Ar_2$ is a heterocyclic ring; each of n is an integer of ≥1; each of $n_1$ is an integer of ≥0; and each of $n+n_1$ is an integer of 0 to the maximum number corresponding to allowable substitution to ring $Ar_1$).

A fifth mode of the present invention is a specific embodiment of the resist underlayer film-forming composition of any one of the first to fourth modes, wherein the polymer is a novolak resin.

A sixth mode of the present invention is a specific embodiment of the resist underlayer film-forming composition of any one of the first to fifth modes, wherein the polymer includes a unit represented by the following formula (1a-1) and/or a unit represented by the following formula (1a-2):

[F4]

(1a-1)

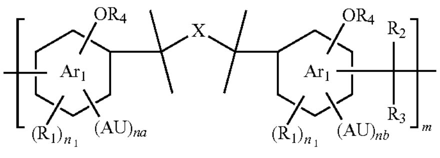

-continued (1a-2)

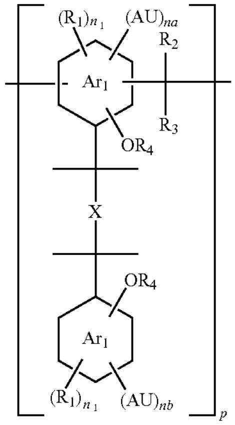

(wherein each of AU represents a group represented by formula (1); each of $R_1$ represents a halogen group, a nitro group, an amino group, an aromatic hydrocarbyl group, a C1 to C10 alkyl group, or a C2 to C6 alkenyl group; each of $R_2$ represents an aromatic hydrocarbyl group or a heterocyclic group; each of $R_3$ represents a hydrogen atom, a phenyl group, or a naphthyl group; when each of $R_2$ and $R_3$ is a phenyl group, they may be linked together to form a fluorene ring; each of $R_4$ represents a hydrogen atom, an acetal group, an acyl group, a glycidyl group, a C1 to C10 alkyl group, or a C2 to C6 alkenyl group; ring $Ar_1$ is a benzene ring; each of X is a benzene ring, and two $—C(CH_3)_2—$ groups bonding to the benzene ring are in m- or p-relation; each of $n_1$ is 0 or 1; the sum $n_a+n_b$ is independently an integer of ≥1; and each of the sum $n_a+n_1$ and the sum $n_b+n_1$ is an integer of 0 to the maximum number corresponding to allowable substitution to ring $Ar_1$).

A seventh mode of the present invention is a specific embodiment of the resist underlayer film-forming composition of any one of the first to sixth modes, wherein the polymer includes a polymer represented by the following formula (1a-3):

[F5]

(1a-3)

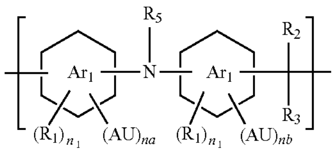

(wherein each of AU represents a group represented by formula (1); each of $R_1$ represents a halogen group, a nitro group, an amino group, a hydroxyl group, a C6 to C40 aromatic hydrocarbyl group, a C1 to C10 alkyl group, or a C2 to C10 alkenyl group, and may include at least one of an ether group, a ketone group, and an ester group; $R_2$ represents a heterocyclic group or a C6 to C40 aromatic hydrocarbyl group, and the heterocyclic group or the aromatic hydrocarbyl group may have at least one substituent selected from among a halogen group, a nitro group, an amino group, a formyl group, a carboxyl group, a hydroxyl group, a C1 to C10 alkyl group, a C1 to C10 alkoxy group, and a C6 to C40 aryl group; $R_3$ represents a hydrogen atom, a heterocyclic group, a C6 to C40 aromatic hydrocarbyl group, a C1 to C10 alkyl group, or a C2 to C10 alkenyl group, and the heterocyclic group, the aromatic hydrocarbyl group, the alkyl group, or the alkenyl group may have at least one substituent selected from among a halogen group, a nitro group, an amino group, and a hydroxyl group; $R_2$ and $R_3$ may be linked together to form a ring structure; $R_3$ represents at least one member selected from among a hydrogen atom, a C1 to C10 alkyl group, a C2 to C10 alkenyl group, and a C6 to C40 aryl group and may include at least one of an ether group, a ketone group, and an ester group; each of ring $Ar_1$ represents a benzene ring or a naphthalene ring; each of $n_1$ is an integer of 0 to 3; the sum $n_a+n_b$ is independently an integer of ≥1; and each of the sum $n_a+n_1$ and the sum $n_b+n_1$ is an integer of 0 to the maximum number corresponding to allowable substitution to ring $Ar_1$).

An eighth mode of the present invention is a specific embodiment of the resist underlayer film-forming composition of any one of the first to seventh modes, wherein the polymer includes a polymer represented by the following formula (1b-1):

[F6]

(1b-1)

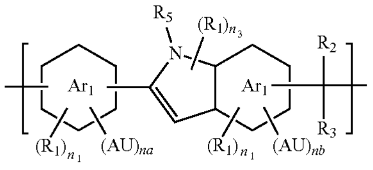

(wherein each of AU represents a group represented by formula (1); each of $R_1$ represents a halogen group, a nitro group, an amino group, a hydroxyl group, a C6 to C40 aromatic hydrocarbyl group, a C1 to C10 alkyl group, or a C2 to C10 alkenyl group, and may include at least one of an ether group, a ketone group, and an ester group; $R_2$ represents a hydrogen atom, a heterocyclic group, or a C6 to C40 aromatic hydrocarbyl group; the heterocyclic group or the aromatic hydrocarbyl group may have at least one substituent selected from among a halogen group, a nitro group, an amino group, a formyl group, a carboxyl group, an alkyl carboxylate ester group, a phenyl group, a hydroxyl group, a C1 to C10 alkoxy group, and a C6 to C40 aryl group; $R_3$ represents a hydrogen atom, a heterocyclic group, a C6 to C40 aromatic hydrocarbyl group, or a C1 to C10 alkyl group; $R_2$ and $R_3$ may be linked together to form a ring structure; ring $Ar_1$ represents a benzene ring, a naphthalene ring, or an anthracene ring; $R_5$ represents at least one member selected from among a hydrogen atom, a C1 to C10 alkyl group, a C2 to C10 alkenyl group, and a C6 to C40 aryl group and may include at least one of an ether group, a ketone group, and an ester group; the sum $n_a+n_b$ is independently an integer of >1; each of $n_1$ and $n_3$ is an integer of >0; each of the sum $n_a+n_1$ and the sum $n_b+n_1$ is an integer of 0 to the maximum number corresponding to allowable substitution to ring $Ar_1$; and $n_3$ is an integer of 0 to the maximum number corresponding to allowable substitution to the $R_1$-bound heterocyclic ring).

In another mode (ninth mode) of the present invention for attaining the aforementioned objects, there is provided a method for producing a resist underlayer film-forming composition, the method employing, as raw materials, a compound having a group represented by formula (1), an aldehyde and/or a ketone, and at least one of a bisphenol, an amine, and a heterocyclic compound.

In a further mode (tenth mode) of the present invention for attaining the aforementioned objects, there is provided a resist underlayer film, which is produced by baking a coating film containing a resist underlayer film-forming composition as recited in any one of the first to eighth modes.

In a further mode (eleventh mode) of the present invention for attaining the aforementioned objects, there is provided a method for producing a resist underlayer film, the method comprising a step of applying, onto a substrate, a resist underlayer film-forming composition as recited in any one of the first to eighth modes, to thereby form a coating film, and a step of baking the coating film.

In a further mode (twelfth mode) of the present invention for attaining the aforementioned objects, there is provided a method for producing a patterned substrate, the method comprising a step of forming a resist underlayer film on a substrate by use of a resist underlayer film-forming composition as recited in any one of the first to eighth modes; a step of forming a specific hard mask on the resist underlayer film; a step of forming a photoresist film on the hard mask; a step of forming a resist pattern through light exposure to and development of the photoresist film; a step of mask-patterning by etching the hard mask through the resist pattern; a step of forming a resist underlayer pattern by etching the resist underlayer film through the mask pattern; and a step of processing the substrate through the resist underlayer pattern.

In a further mode (thirteenth mode) of the present invention for attaining the aforementioned objects, there is provided a method for producing a semiconductor device, the method comprising a step of forming a resist underlayer film on a substrate by use of a resist underlayer film-forming composition as recited in any one of the first to eighth modes; a step of etching the resist underlayer film through a specific pattern, and a step of processing the substrate through the patterned resist underlayer film.

Effects of the Invention

The present invention can provide a resist underlayer film-forming composition which can form a resist underlayer film insoluble in a photoresist solution and having high etching selectivity and which contains a polymer having excellent solubility in a solvent of the resist underlayer film-forming composition, as well as a production method therefor. The present invention can also provide a resist underlayer film and a method for producing the film, a method for producing a patterned substrate, and a method for producing a semiconductor device, which can be achieved by use of the resist underlayer film-forming composition.

MODES FOR CARRYING OUT THE INVENTION

Hereinafter, specific embodiments of the present invention will be described in detail.

<Resist Underlayer Film-Forming Composition and Production Method Therefor>

(Group Represented by Formula (1))

The resist underlayer film-forming composition according to one embodiment (hereinafter may be referred to simply as "composition") is suited for forming a resist underlayer film for use in a multi-layer resist process.

The multi-layer resist process also called as a "multi-layer process." In this process, a stacked body in which inorganic layers and organic layers are alternatingly stacked is subjected to etching by alternatingly using etching gases having different etching selectivities to the inorganic layers and the organic layers (e.g., an oxygen-based gas or a hydrogen-based gas, and a halogen-containing gas (e.g., $CF_4$) having a different etching selectivity thereto), to thereby pattern the substrate.

An example of the stacked body includes a semiconductor substrate (i.e., an inorganic layer in the multi-layer resist process), a resist underlayer film formed on the semiconductor substrate (i.e., an organic layer in the multi-layer resist process), a hard mask formed on the resist underlayer film (i.e., an inorganic layer in the multi-layer resist process), and a photoresist film formed on the hard mask (i.e., an organic layer in the multi-layer resist process). The aforementioned composition is suited for forming the resist underlayer film among the above elements.

The above composition contains a polymer to which there is attached a group represented by the following formula (1) (hereinafter, the polymer may be referred to simply as a "polymer").

[F7]

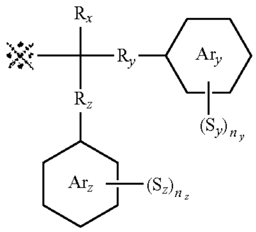

(1)

In formula (1), each of $R_x$, $S_y$, and $S_z$ represents a hydrogen atom or a monovalent organic group; each of $R_y$ and $R_z$ represents a single bond or a divalent organic group; each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween; $n_y$ is an integer of 0 to the maximum number corresponding to allowable substitution to ring $Ar_y$; $n_z$ is an integer of 0 to the maximum number corresponding to allowable substitution to ring $Ar_z$; and * is a polymer bonding site. The polymer essentially has one or more groups represented by formula (1).

The polymer having a group represented by formula (1) exhibits excellent solubility in a solvent of the above composition. Specifically, as assessed in the below-mentioned Examples, no precipitation of the polymer is observed in a solvent (e.g., methyl 2-hydroxyisobutyrate), which is used in a solubility test. Thus, the polymer is readily re-precipitated when an organic solvent such as methanol is used. As a result, the purity of the polymer can be readily enhanced.

The group represented by formula (1) is designed so as to have a higher carbon content. The design is based on the tendency focused on by the present inventors; i.e., etching selectivity can be readily enhanced by a higher carbon content of the relevant compound. Therefore, the polymer leads to form a resist underlayer film having high etching resistance to an etching gas for use in the multi-layer resist process (e.g., a halogen-containing gas such as $CF_4$), thus having high etching selectivity.

As assessed in the below-mentioned Examples, the resist underlayer film produced by use of the above composition is insoluble in a photoresist solution. By use of such a resist underlayer film, intermixing thereof with a photoresist layer can be readily prevented in the multi-layer resist process.

As described above, the composition can form a resist underlayer film insoluble in a photoresist solution and having high etching selectivity and contains a polymer having excellent solubility in a solvent of the composition. Thus, the multi-layer resist process can be performed suitably and simply, when the above composition is used. Smoothly carrying out the multi-layer resist process will facilitate production of a micro-patterned substrate having a considerable pattern depth.

In formula (1), each of $R_x$, $S_y$, and $S_z$ represents a hydrogen atom or a monovalent organic group. The monovalent organic group has 1 to 20 carbon atoms and may include at least one of a nitrogen atom, an oxygen atom, and a sulfur atom. The monovalent organic group may have a linear-chain skeleton or a branched-chain skeleton and may further include a cyclic skeleton. Further, the monovalent organic group may have an unsaturated bond.

In formula (1), each of $R_y$ and $R_z$ represents a single bond or a divalent organic group. The divalent organic group has 1 to 20 carbon atoms and may include at least one of a nitrogen atom, an oxygen atom, and a sulfur atom. The divalent organic group may have a linear-chain skeleton or a branched-chain skeleton and may further include a cyclic skeleton. Further, the divalent organic group may have an unsaturated bond.

In formula (1), each of ring $Ar_y$ and ring $Ar_z$ represents a C4 to C20 cyclic alkyl group or a C6 to C30 aryl group. Among them, at least one of ring $Ar_y$ and ring $Ar_z$ is preferably a C6 to C30 aryl group. Notably, ring $Ar_y$ and ring $Ar_z$ may be linked together to form a new ring structure therebetween.

Thus, specific examples of the group represented by formula (1) are as follows.

[F8]

(1-1)

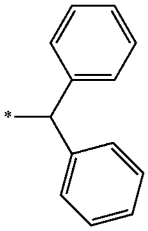

(1-2)

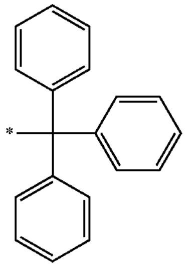

-continued
(1-3)
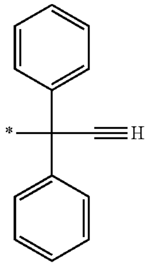
(1-4)
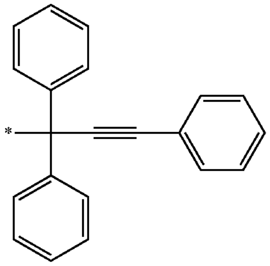
(1-5)
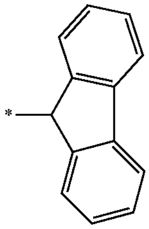
(1-6)
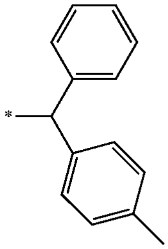
(1-7)
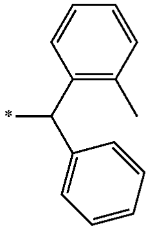
(1-8)
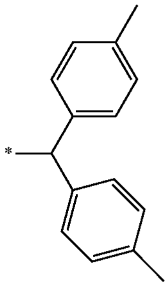
-continued
(1-9)
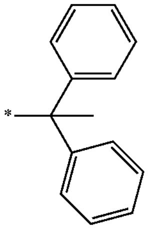
(1-10)
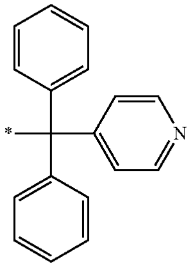
(1-11)
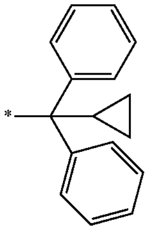
(1-12)
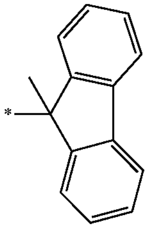
(1-13)
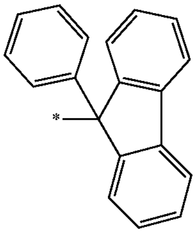
(1-14)
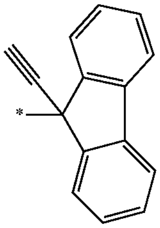

-continued (1-15)

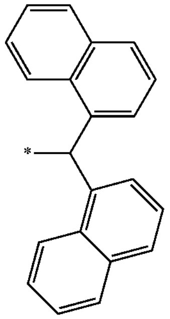

(in formulas (1-1) to (1-15), * is a polymer bonding site).

Among the above formulas, the group represented by formula (1) is preferably at least one of formulas (1-1) to (1-5). However, the group represented by formula (1) is not limited to the above formulas, so long as the effects of the present invention can be attained.

(Polymer)

The aforementioned polymer includes at least one of a unit represented by formula (1a) and a unit represented by formula (1b):

[F9]

(1a)

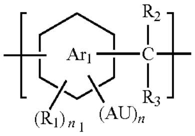

(1b)

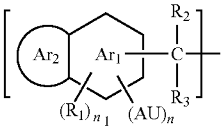

In formulas (1a) and (1b), each of AU represents a group represented by formula (1); each of $R_1$ represents a halogen group, a nitro group, an amino group, a hydroxyl group, a glycidyl ether group, an aromatic hydrocarbyl group, a C1 to C10 alkyl group, or a C2 to C10 alkenyl group and may include at least one of an ether group, a ketone group, and an ester group; each of $R_2$ represents a hydrogen atom, an aromatic hydrocarbyl group, or a heterocyclic group; each of $R_3$ represents a hydrogen atom, an aromatic hydrocarbyl group, a heterocyclic group, a C1 to C10 alkyl group, or a C2 to C10 alkenyl group; each of the aromatic hydrocarbyl group and the heterocyclic group of $R_2$ and $R_3$ may have at least one substituent selected from among a halogen group, a nitro group, an amino group, a formyl group, a carboxyl group, an alkyl carboxylate ester group, a hydroxyl group, a C1 to C10 alkyl group, a C1 to C10 alkoxy group, and a C6 to C40 aryl group; $R_2$ and $R_3$ may be linked together to form a ring structure; each of ring $Ar_1$ represents a benzene ring, a naphthalene ring, or an anthracene ring; ring $Ar_2$ is a heterocyclic ring; each of n is an integer of ≥1; each of $n_1$ is an integer of ≥0; and each of $n+n_1$ is an integer of 0 to the maximum number corresponding to allowable substitution to ring $Ar_1$.

The possible mode of the above polymer includes the following three cases: the polymer including both a unit represented by formula (1a) and a unit represented by formula (1b); the polymer including a unit represented by formula (1a) but no unit represented by formula (1b); and the polymer including a unit represented by formula (1b) but no unit represented by formula (1a).

The lower limit of the weight average molecular weight of the polymer is, for example, 100, 400, or 600, and the upper limit is, for example, 50,000, 40,000, or 30,000. These lower and upper limits of the weight average molecular weight are given as merely examples. The weight average molecular weight is determined through gel permeation chromatography (GPC) and is reduced to polystyrene.

The aforementioned polymer includes a novolak resin. Novolak resin can be produced through polymerization by use of, as raw materials, an aldehyde and/or a ketone, and at least one member of a bisphenol, an amine, and a heterocyclic compound. The polymer may be produced by collectively feeding the raw materials and a compound having a group represented by formula (1) (hereinafter may be referred to as an "addition unit") and allowing the mixture to polymerize. In an alternative manner, the raw materials are allowed to polymerize, and an addition unit is bound to the thus-formed novolak resin.

The polymerization reaction conditions, including the presence or absence and the type of an acid catalyst, the presence or absence and the type of a reaction solvent, timing of adding ingredients, proportions of ingredients, and reaction time and temperature, may be appropriately selected in accordance with the polymer to be produced. Examples of the acid catalyst include inorganic acids such as sulfuric acid, phosphoric acid, and perchloric acid; organic sulfonic acids such as methanesulfonic acid, p-toluenesulfonic acid, and p-toluenesulfonic acid monohydrate; and carboxylic acids such as formic acid and oxalic acid. No particular limitation is imposed on the reaction solvent, so long as it does not impede the polymerization reaction. There may be used any of known solvents such as propylene glycol monomethyl ether, propylene glycol monomethyl ether acetate, and 1,4-dioxane. When a liquid-form acid catalyst is used, the catalyst may also serve as a reaction solvent. These acid catalysts or reaction solvents may be used singly or in combination of two or more species.

Specific examples of the addition unit are as follows.

[F10]

(1-1a)

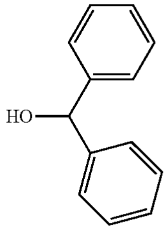

(1-2a)

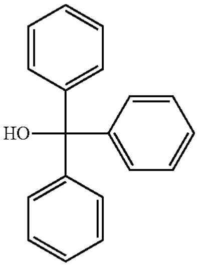

-continued
(1-3a)
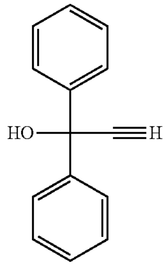
(1-4a)
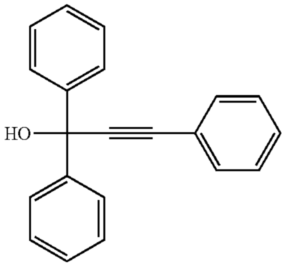
(1-5a)
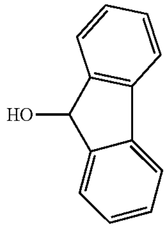
(1-6a)
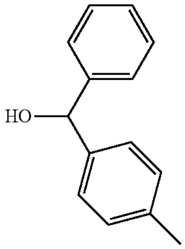
(1-7a)
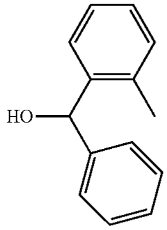
(1-8a)
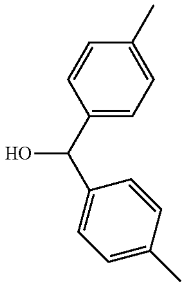
-continued
(1-9a)
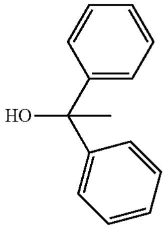
(1-10a)
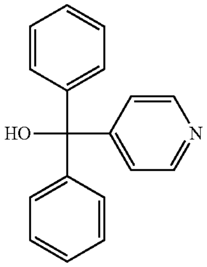
(1-11a)
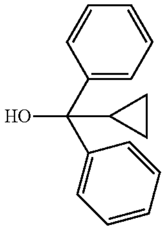
(1-12a)
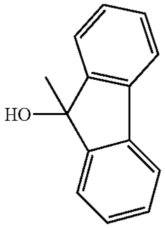
(1-13a)
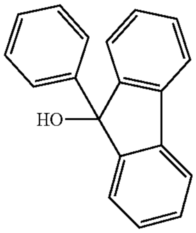
(1-14a)
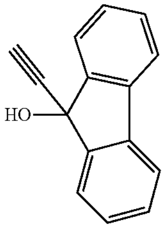

-continued (1-15a)

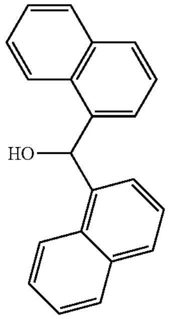

The lower limit of the molecular weight of the addition unit is, for example, 50, 100, or 150, and the upper limit is, for example, 500, 400, or 300. The molecular weight of at least one addition unit for producing the polymer, and further, the total molecular weight of all the addition units for producing the polymer, preferably fall within the above conditions.

Examples of the aldehyde include an aromatic aldehyde, a saturated aliphatic aldehyde, an unsaturated aliphatic aldehyde, and a heterocyclic aldehyde. These aldehydes may be used singly or in combination of two or more species.

Examples of the aromatic aldehyde include 1-pyrenecarboxyaldehyde, benzaldehyde, naphthaldehyde, anthracenecarboxyaldehyde, anisaldehyde, terephthaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, and acetoxybenzaldehyde. These aldehydes may be used singly or in combination of two or more species.

Examples of the saturated aliphatic aldehyde include formaldehyde, paraformaldehyde, acetaldehyde, propylaldehyde, butyraldehyde, isobutyraldehyde, valeraldehyde, capronaldehyde, 2-methylbutyraldehyde, hexaldehyde, undecanecarboxaldehyde, 7-methoxy-3,7-dimethyloctylaldehyde, cyclohexanecarboxyaldehyde, 3-methyl-2-butyraldehyde, glyoxal, malonaldehyde, succinaldehyde, glutaraldehyde, and adipaldehyde. These aldehydes may be used singly or in combination of two or more species.

Examples of the unsaturated aliphatic aldehyde include acrolein and methacrolein. These aldehydes may be used singly or in combination of two or more species.

Examples of the heterocyclic aldehyde include furfural, pyridinecarboxyaldehyde, and thiophenecarboxyaldehyde. These aldehydes may be used singly or in combination of two or more species.

Examples of the aromatic ketone include diphenyl ketone, phenyl naphthyl ketone, dinaphthyl ketone, phenyl tolyl ketone, ditolyl ketone, and 9-fluorenone. These ketones may be used singly or in combination of two or more species.

Specific examples of the bisphenol, amine, and heterocyclic compound will be described in another section. Notably, when the bisphenol is used, a first polymer is yielded. Similarly, when the amine is used, a second polymer is yielded, whereas when the heterocyclic compound is used, a third polymer is yielded.

The unit represented by formula (1a) or (1b) has a relatively flexible skeleton. Such a flexible skeleton is generally advantageous in that it facilitates intrusion of the composition into grooves defined by steps of a substrate, and formation of a highly flat coating film on a substrate even having steps. From these viewpoints, the aforementioned polymer is preferably at least one member of a first polymer, a second polymer, and a third polymer.

(First Polymer)

The first polymer includes a unit represented by formula (1a-1) and/or a unit represented by formula (1a-2).

[F11]

(1a-1)

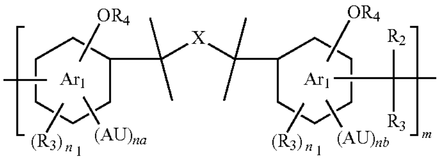

[F12]

(1a-2)

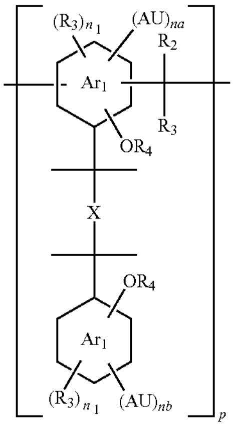

In formulas (1a-1) and (1a-2), AU has the same meanings as defined above; each of $R_1$ represents a halogen group, a nitro group, an amino group, an aromatic hydrocarbyl group, a C1 to C10 alkyl group, or a C2 to C6 alkenyl group; each of $R_2$ represents an aromatic hydrocarbyl group or a heterocyclic group; each of $R_3$ represents a hydrogen atom, a phenyl group, or a naphthyl group; when each of $R_2$ and $R_3$ is a phenyl group, they may be linked together to form a fluorene ring; each of $R_4$ represents a hydrogen atom, an acetal group, an acyl group, a glycidyl group, a C1 to C10 alkyl group, or a C2 to C6 alkenyl group; ring $Ar_1$ is a benzene ring; each of X is a benzene ring, and two —$C(CH_3)_2$— groups bonding to the benzene ring are in m- or p-relation; each of $n_1$ is 0 or 1; the sum $n_a+n_b$ is independently an integer of ≥1; and each of the sum $n_a+n_1$ and the sum $n_b+n_1$ is an integer of 0 to the maximum number corresponding to allowable substitution to ring $Ar_1$.

The possible mode of the first polymer includes the following three cases: the polymer including both a unit represented by formula (1a-1) and a unit represented by formula (1a-2); the polymer including a unit represented by formula (1a-1) but no unit represented by formula (1a-2); and the polymer including a unit represented by formula (1a-2) but no unit represented by formula (1a-1).

Specific examples of the skeleton of the unit represented by formula (1a-1) or (1a-2) are as follows. However, the group represented by formula (1) is omitted in the following specific examples. The first polymer is formed through bonding of the group represented by formula (1) to any of the rings of a polymer belonging to the specific examples.

[F13]
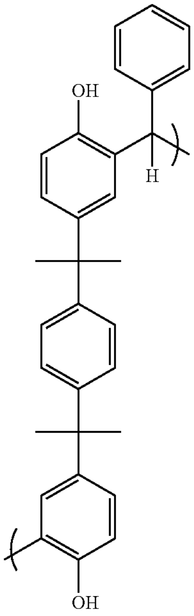
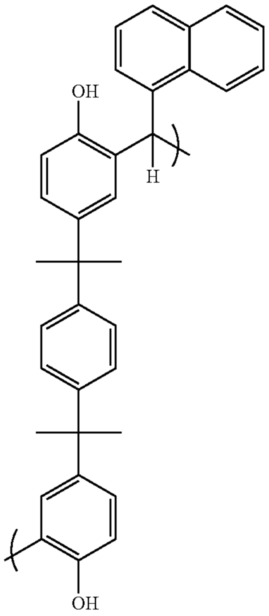
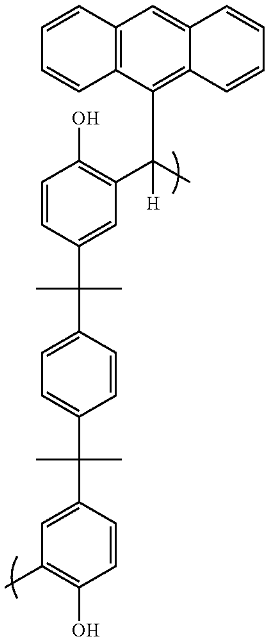
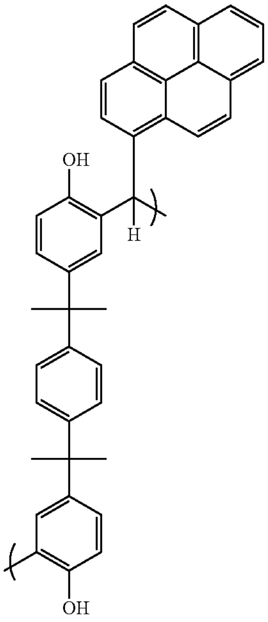
-continued
[F14]
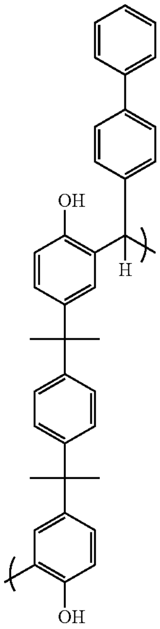
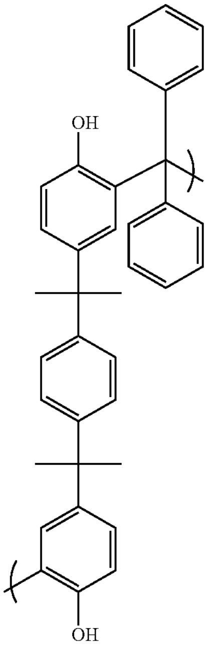
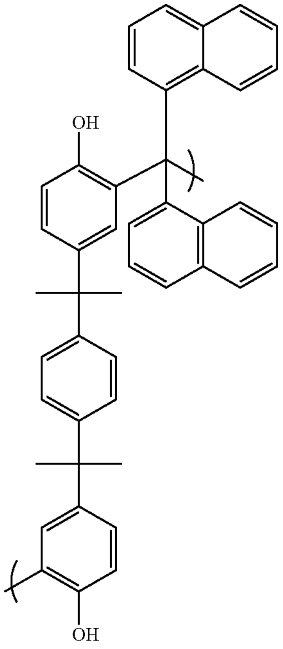

-continued
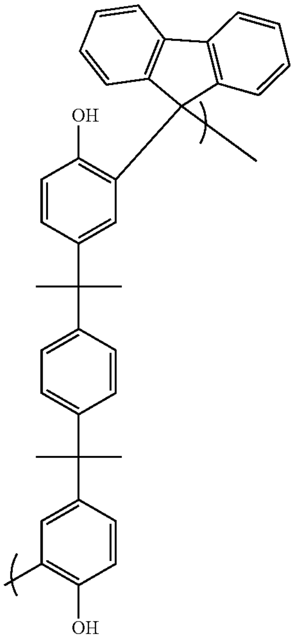
[F15]
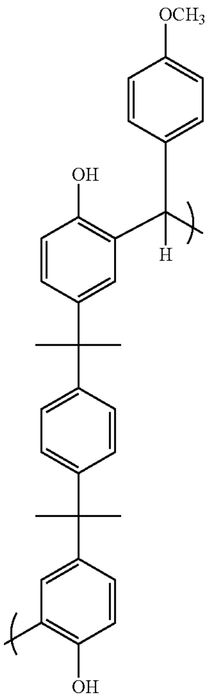
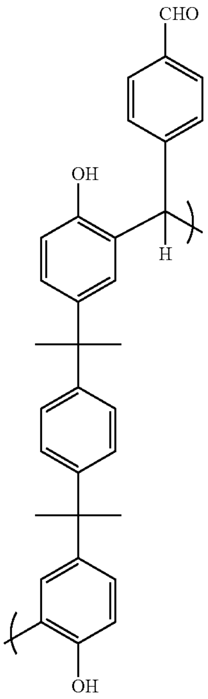
-continued
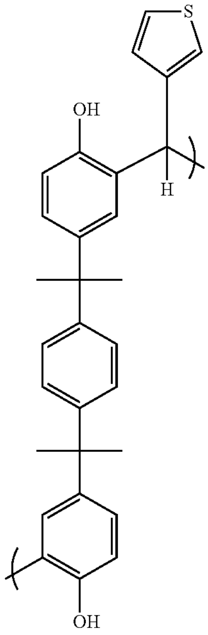
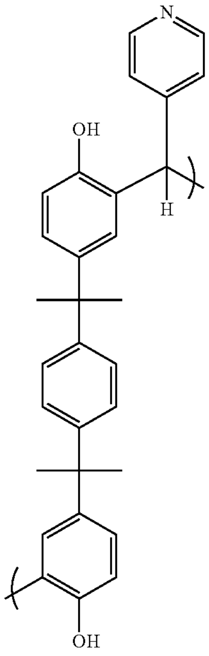
[F16]
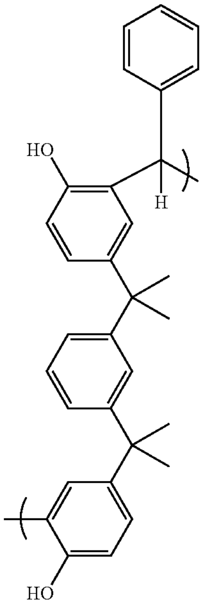
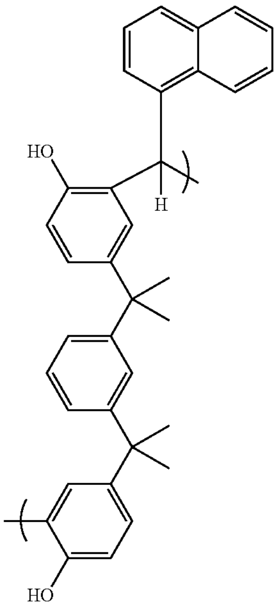

-continued
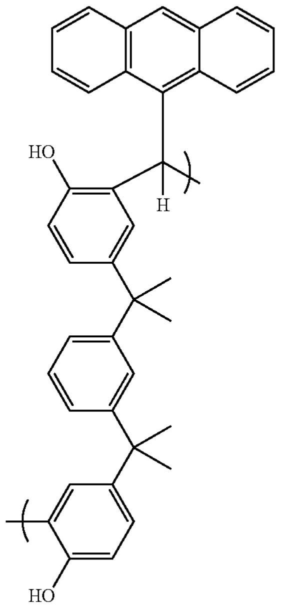
-continued
[F17]
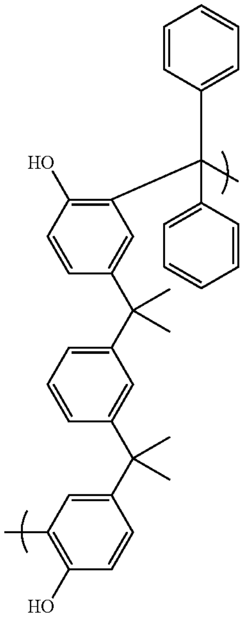
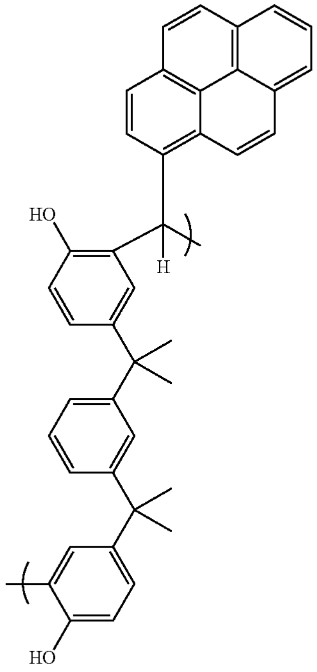
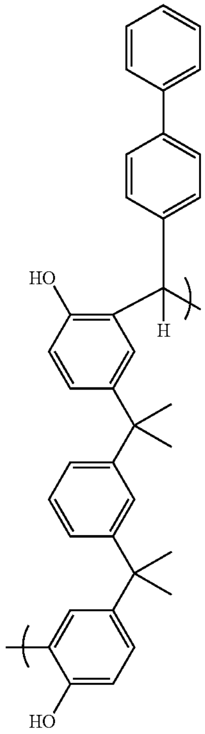
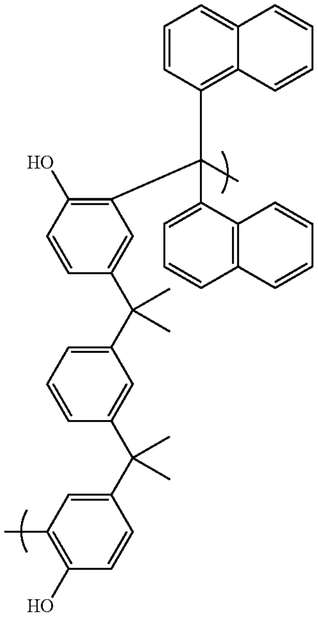

-continued
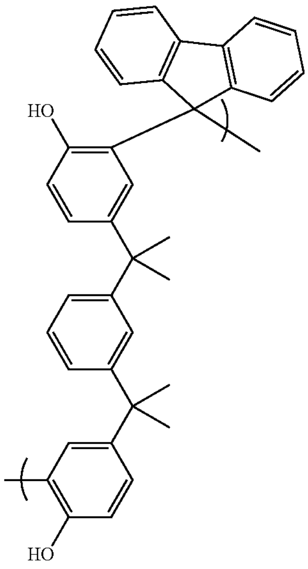
[F18]
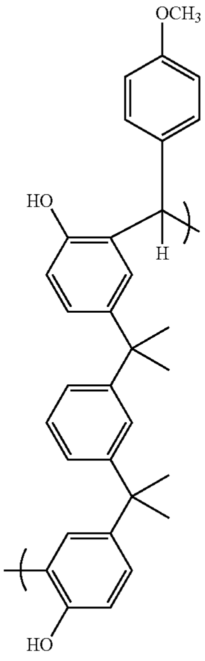
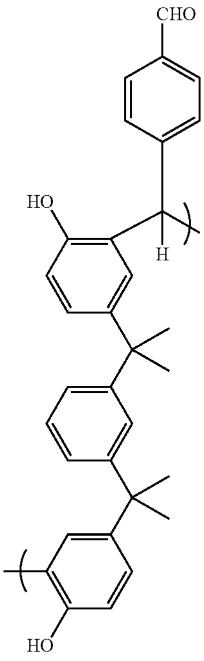
-continued
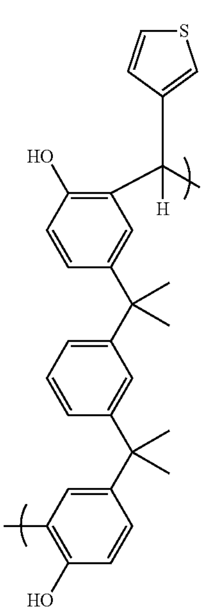
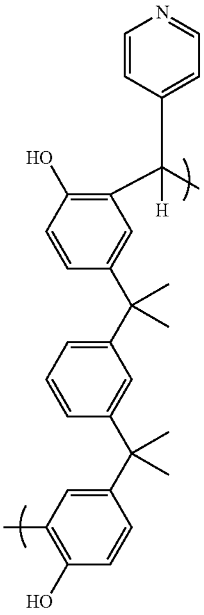
[F19]
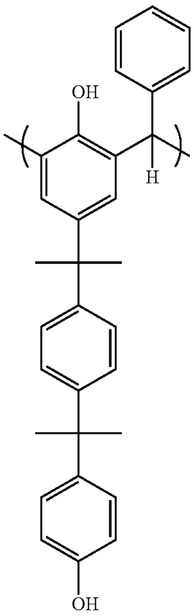
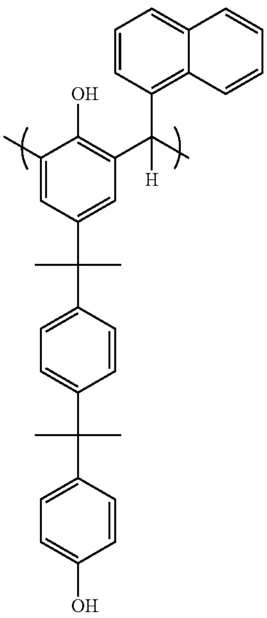

-continued
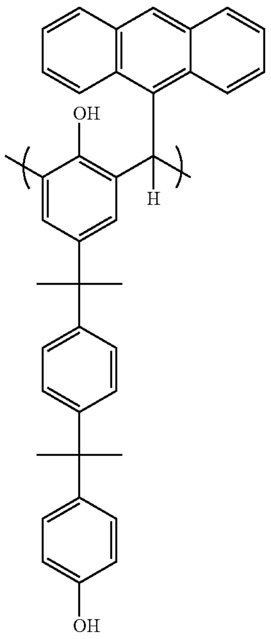
[F20]
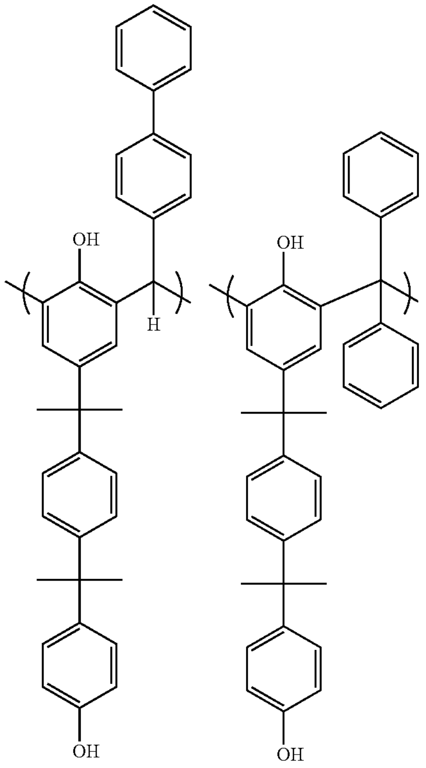
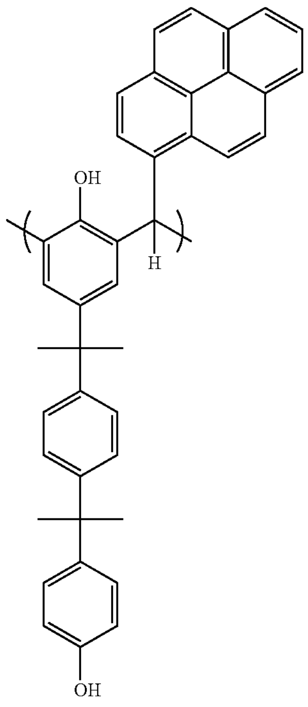
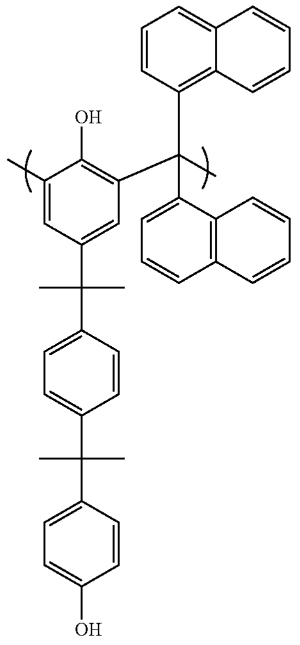

-continued
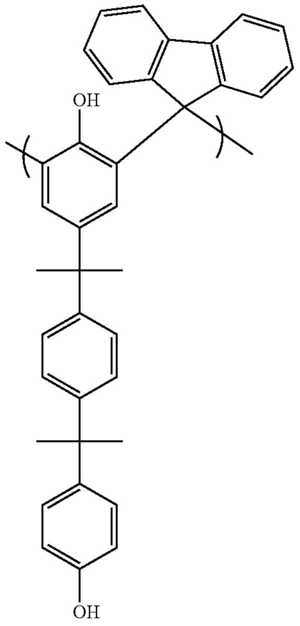
-continued
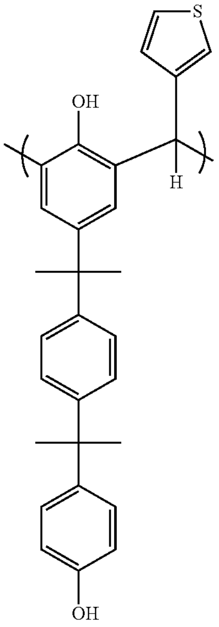
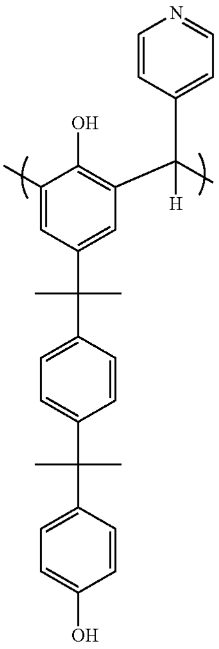
[F21]
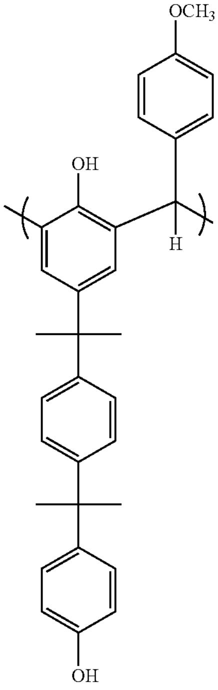
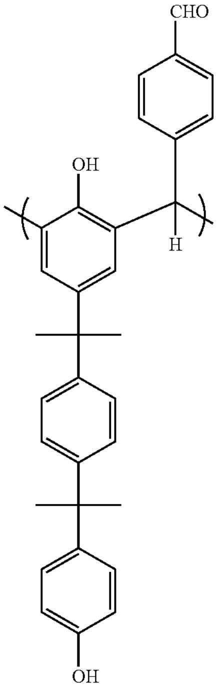
[F22]
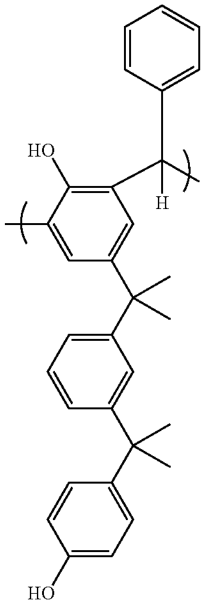
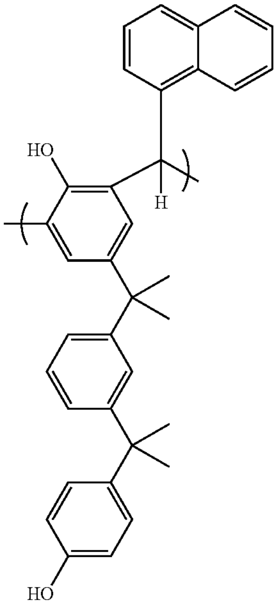

-continued
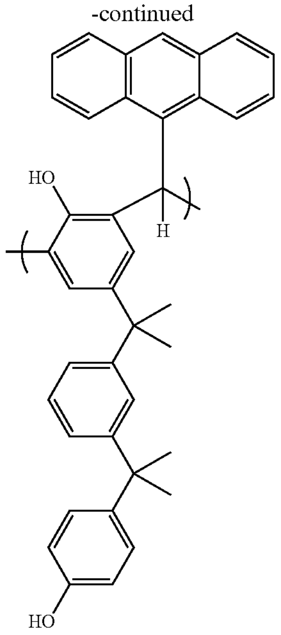
-continued
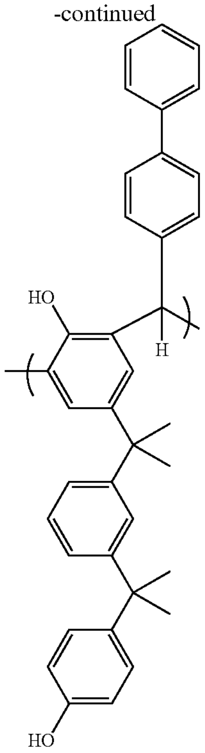
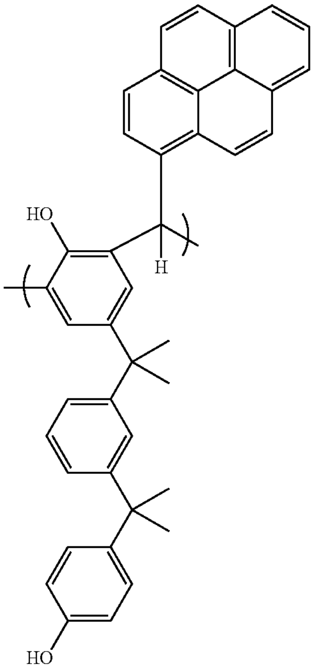
[F23]
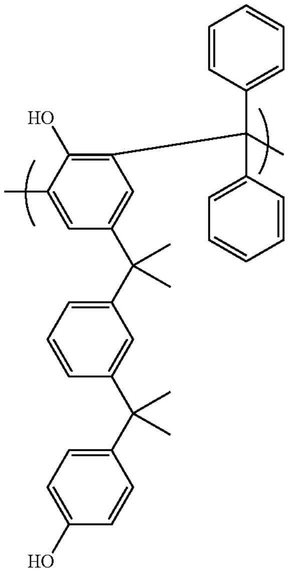

-continued
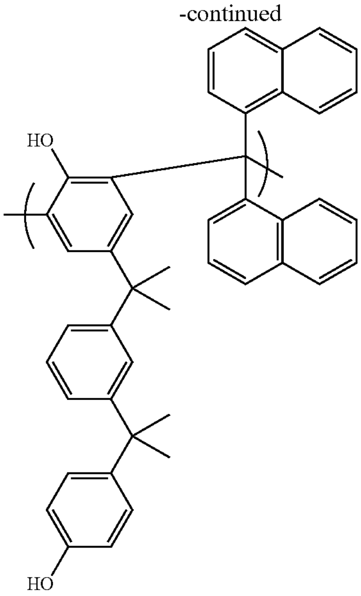
-continued
[F24]
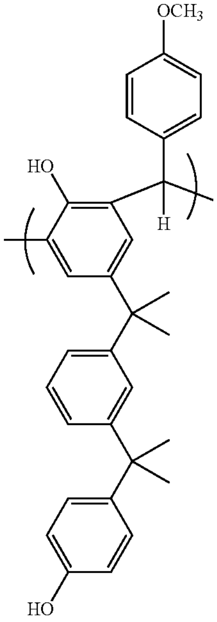
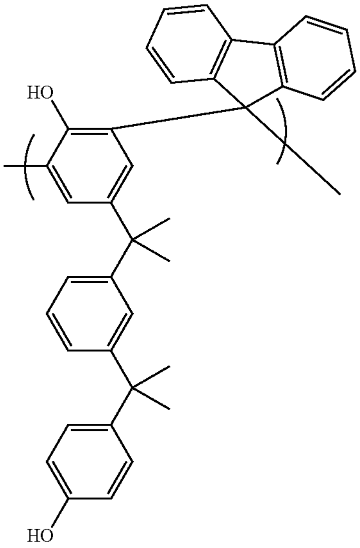
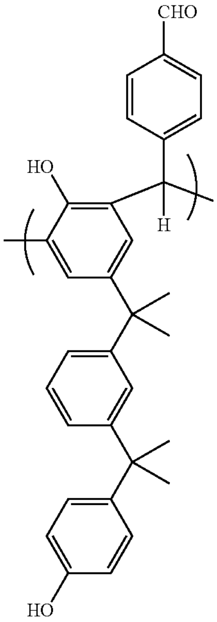

-continued

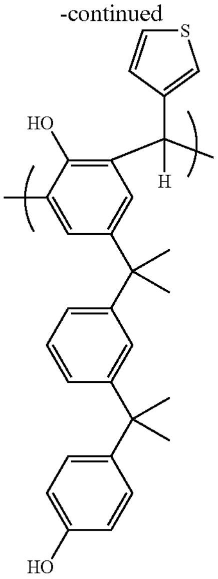

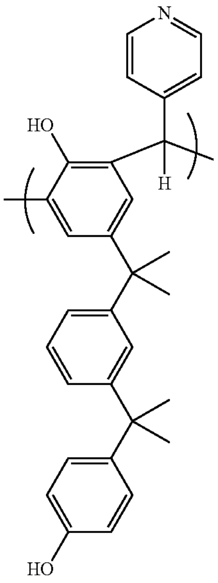

Notably, the skeleton of the first polymer is not limited to the above specific examples, so long as the effects of the present invention can be attained.

The first polymer is synthesized through polymerization of an addition unit, an aldehyde and/or a ketone, and a phenol. Examples of the phenol include 1,3-bis[2-(4-hydroxyphenyl)-2-propyl]benzene, 2-phenylindole, 1-phenyl-2-naphthylamine, and 1,4-bis[2-(4-hydroxyphenyl)-2-propyl]benzene. These bisphenols may be used singly or in combination of two or more species.

(Second Polymer)

The second polymer includes a polymer represented by formula (1a-3).

[F25]

(1a-3)

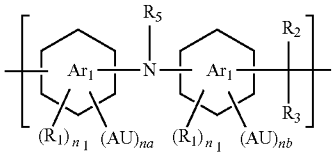

In formula (1a-3), AU has the same meanings as defined above; each of $R_1$ represents a halogen group, a nitro group, an amino group, a hydroxyl group, a C6 to C40 aromatic hydrocarbyl group, a C1 to C10 alkyl group, or a C2 to C10 alkenyl group, and may include at least one of an ether group, a ketone group, and an ester group; $R_2$ represents a heterocyclic group or a C6 to C40 aromatic hydrocarbyl group, and the heterocyclic group or the aromatic hydrocarbyl group may have at least one substituent selected from among a halogen group, a nitro group, an amino group, a formyl group, a carboxyl group, a hydroxyl group, a C1 to C10 alkyl group, a C1 to C10 alkoxy group, and a C6 to C40 aryl group; $R_3$ represents a hydrogen atom, a heterocyclic group, a C6 to C40 aromatic hydrocarbyl group, a C1 to C10 alkyl group, or a C2 to C10 alkenyl group, and the heterocyclic group, the aromatic hydrocarbyl group, the alkyl group, or the alkenyl group may have at least one substituent selected from among a halogen group, a nitro group, an amino group, and a hydroxyl group; $R_2$ and $R_3$ may be linked together to form a ring structure; $R_5$ represents at least one member selected from among a hydrogen atom, a C1 to C10 alkyl group, a C2 to C10 alkenyl group, and a C6 to C40 aryl group and may include at least one of an ether group, a ketone group, and an ester group; each of ring $Ar_1$ represents a benzene ring or a naphthalene ring; each of $n_1$ is an integer of 0 to 3; the sum $n_a+n_b$ is independently an integer of >1; and each of the sum $n_a+n_1$ and the sum $n_b+n_1$ is an integer of 0 to the maximum number corresponding to allowable substitution to ring $Ar_1$.

Also, the second polymer includes a copolymer formed from a unit represented by formula (1a-3) and a unit represented by formula (1a-4).

[F26]

(1a-4)

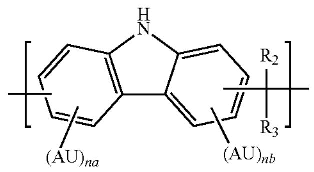

In formula (1a-4), AU, $R_2$, and $R_3$ have the same meanings as defined above; the sum $n_a+n_b$ is independently an integer of ≥1; and each of $n_a$ and $n_1$ is an integer of 0 to the maximum number corresponding to allowable substitution to ring $Ar_1$.

Specific examples of the skeleton of the unit represented by formula (1a-3) or (1a-4) are as follows. However, the group represented by formula (1) is omitted in the following specific examples. The second polymer is formed through bonding of the group represented by formula (1) to any of the rings of a polymer belonging to the specific examples.
[F27]
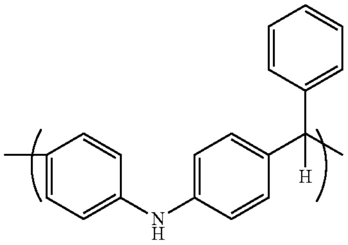
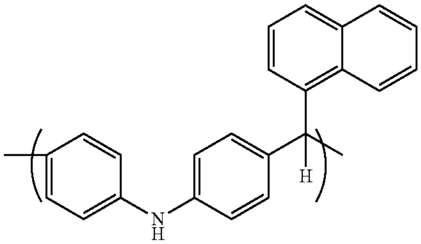
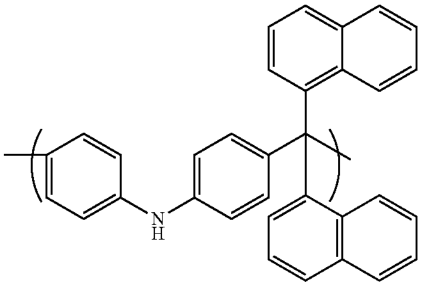
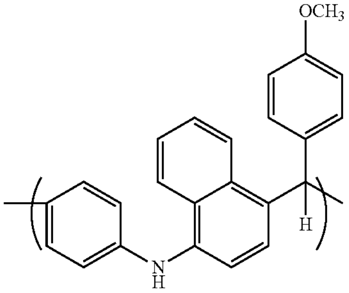
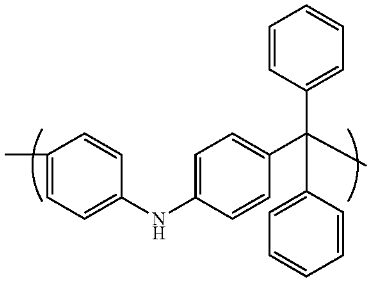
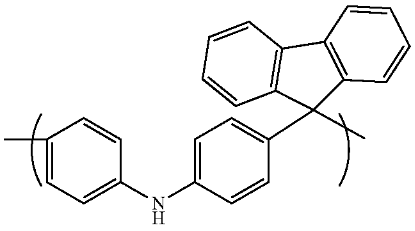
-continued
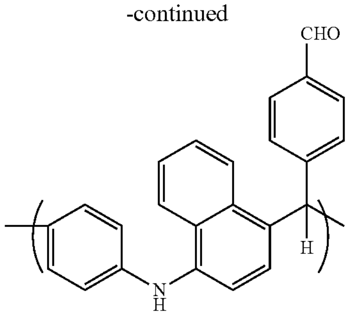
[F28]
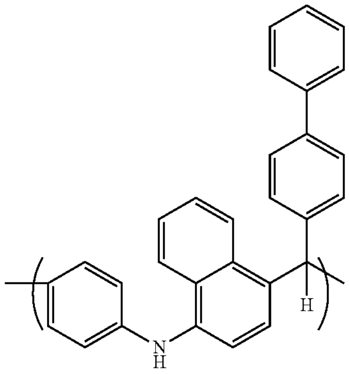
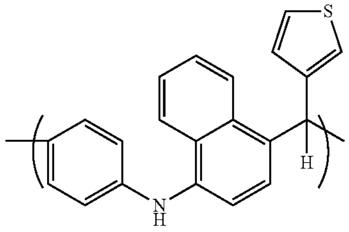
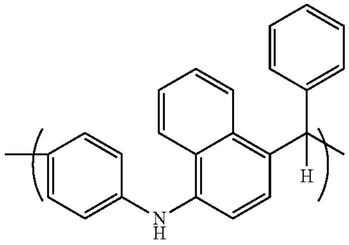
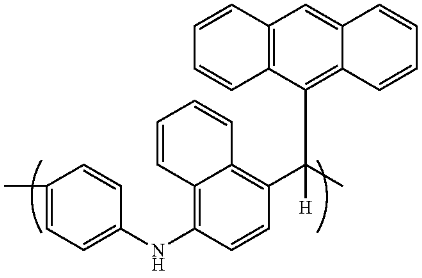
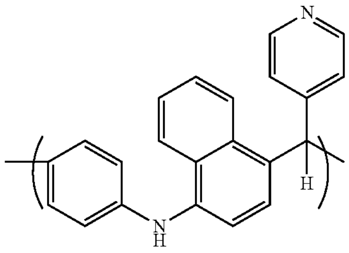

-continued
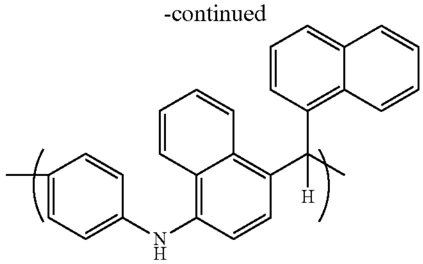
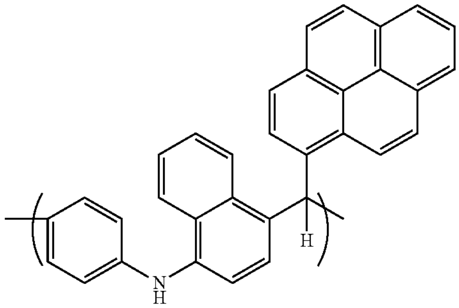
[F29]
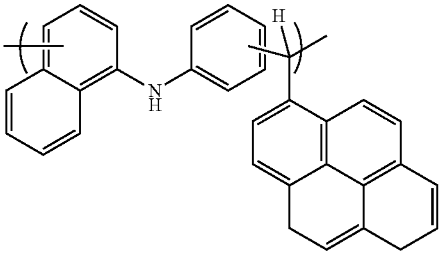
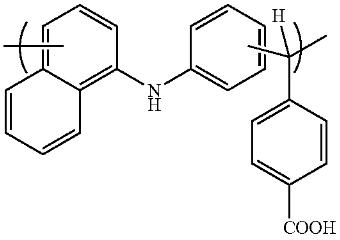
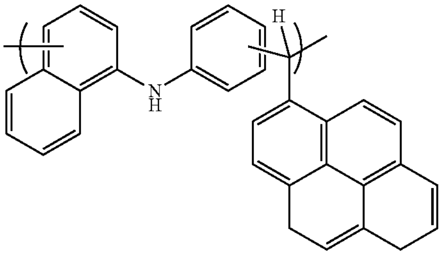
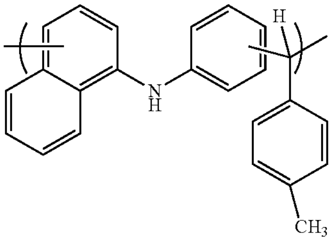
-continued
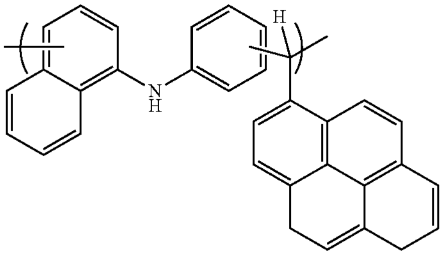
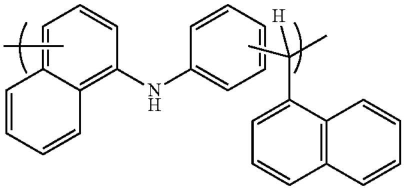
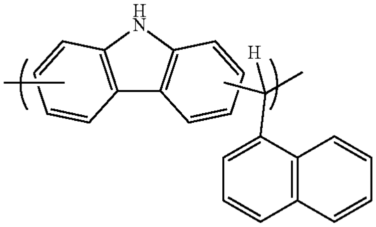
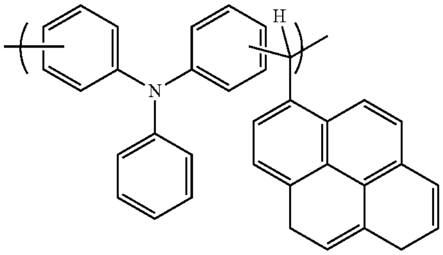
[F30]
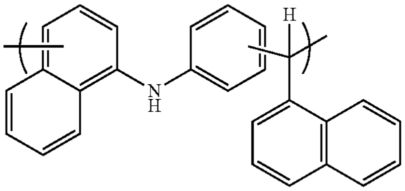
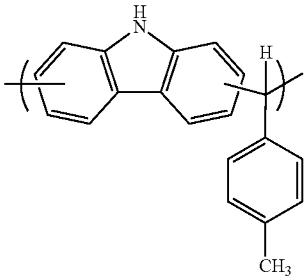
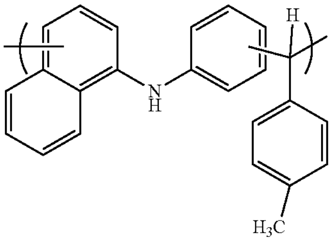

-continued

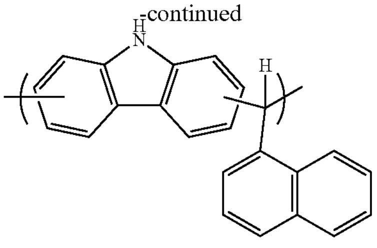

Notably, the skeleton of the second polymer is not limited to the above specific examples, so long as the effects of the present invention can be attained.

The second polymer is synthesized through polymerization of an addition unit, an aldehyde and/or a ketone, and an amine. Examples of the amine include a carbazole and a triphenylamine. These amines may be used singly or in combination of two or more species.

Examples of the carbazole include carbazole, N-methylcarbazole, N-ethylcarbazole, 1,3,6,8-tetranitrocarbazole, 3,6-diaminocarbazole, 3,6-dibromo-9-ethylcarbazole, 3,6-dibromo-9-phenylcarbazole, 3,6-dibromocarbazole, 3,6-dichlorocarbazole, 3-amino-9-ethylcarbazole, 3-bromo-9-ethylcarbazole, 4,4'-bis(9H-carbazol-9-yl)biphenyl, 4-glycidylcarbazole, 4-hydroxycarbazole, 9-(1H-benzotriazol-1-ylmethyl)-9H-carbazole, 9-acetyl-3,6-diiodocarbazole, 9-benzoylcarbazole, 9-benzoylcarbazole-6-dicarboxyaldehyde, 9-benzylcarbazole-3-carbaldehyde, 9-methylcarbazole, 9-phenylcarbazole, 9-vinylcarbazole, carbazole potassium, carbazole-N-carbonylchloride, N-ethylcarbazole-3-carboxyaldehyde, and N-((9-ethylcarbazol-3-yl)methylene)-2-methyl-1-indolinylamine. These carbazoles may be used singly or in combination of two or more species.

Examples of the triphenylamine include triphenylamine. The triphenylamine may have a substituent. Examples of the substituent include a halogen group, a nitro group, an amino group, a hydroxyl group, a C1 to C10 alkyl group, a C2 to C10 alkenyl group, and a C6 to C40 aryl group. The substituent may include an ether group, a ketone group, or an ester group. These triphenylamines may be used singly or in combination of two or more species.

(Third Polymer)

The third polymer includes a polymer represented by formula (1b-1).

[F31]

(1b-1)

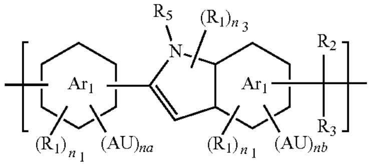

In formula (1b-1), AU has the same meanings as defined above; each of $R_1$ represents a halogen group, a nitro group, an amino group, a hydroxyl group, a C6 to C40 aromatic hydrocarbyl group, a C1 to C10 alkyl group, or a C2 to C10 alkenyl group, and may include at least one of an ether group, a ketone group, and an ester group; $R_2$ represents a hydrogen atom, a heterocyclic group or a C6 to C40 aromatic hydrocarbyl group, and the heterocyclic group or the aromatic hydrocarbyl group may have at least one substituent selected from among a halogen group, a nitro group, an amino group, a formyl group, a carboxyl group, an alkyl carboxylate ester group, a phenyl group, a hydroxyl group, a C1 to C10 alkoxy group, and a C6 to C40 aryl group; $R_3$ represents a hydrogen atom, a heterocyclic group, a C6 to C40 aromatic hydrocarbyl group, or a C1 to C10 alkyl group; $R_2$ and $R_3$ may be linked together to form a ring structure; ring $Ar_1$ represents a benzene ring, a naphthalene ring, or an anthracene ring; $R_5$ represents at least one member selected from among a hydrogen atom, a C1 to C10 alkyl group, a C2 to C10 alkenyl group, and a C6 to C40 aryl group and may include at least one of an ether group, a ketone group, and an ester group; the sum $n_a+n_b$ is independently an integer of ≥1; and each of $n_1$ and $n_3$ is an integer of ≥0; each of the sum $n_a+n_1$ and the sum $n_b+n_1$ is an integer of 0 to the maximum number corresponding to allowable substitution to ring $Ar_1$; and $n_3$ is an integer of 0 to the maximum number corresponding to allowable substitution to the $R_1$-bound heterocyclic ring.

Specific examples of the skeleton of the unit represented by formula (1b-1) are as follows. However, the group represented by formula (1) is omitted in the following specific examples. The third polymer is formed through bonding of the group represented by formula (1) to any of the rings of a polymer belonging to the specific examples.

[F32]

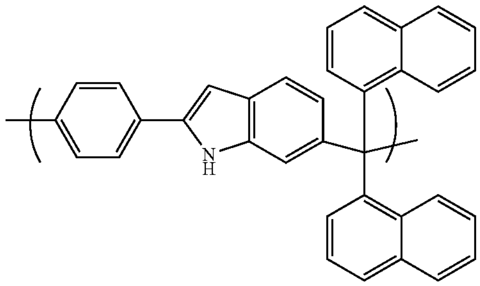

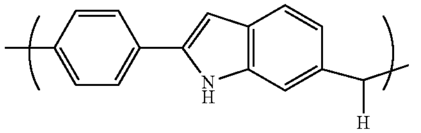

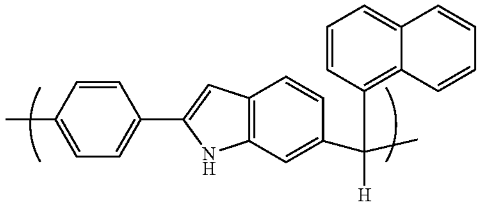

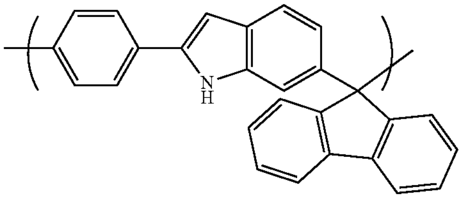

-continued

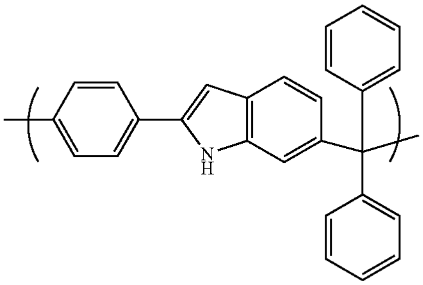

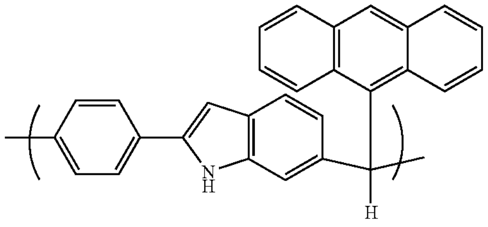

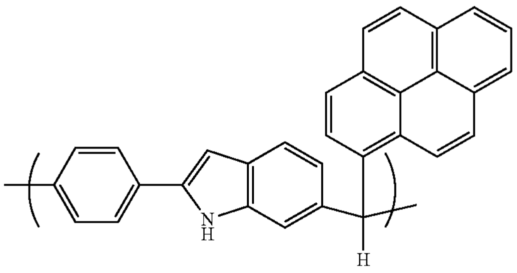

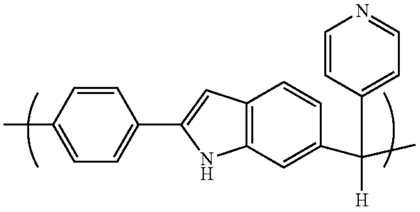

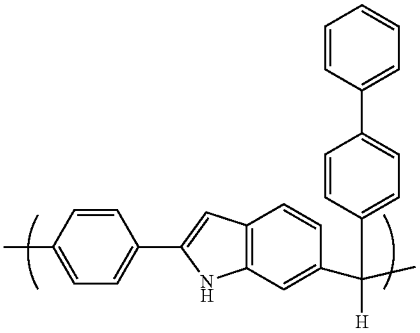

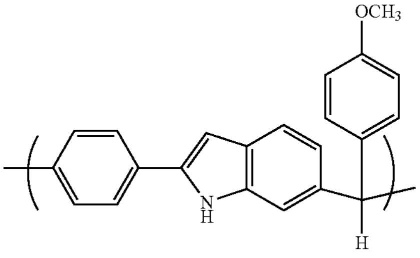

-continued

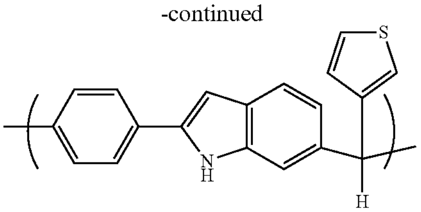

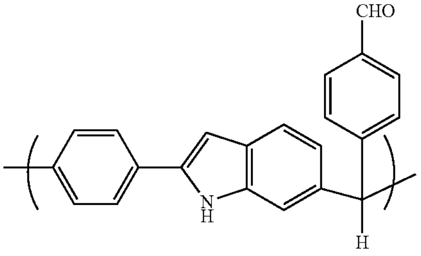

Notably, the skeleton of the third polymer is not limited to the above specific examples, so long as the effects of the present invention can be attained.

The third polymer is synthesized through polymerization of an addition unit, an aldehyde and/or a ketone, and a heterocyclic compound. Examples of the heterocyclic compound include heterocyclic compounds each having 5- to 6-membered, heterocyclic group containing N, S, and/or O. Specific examples of the heterocyclic group include a pyrrole group, a furan group, a thiophene group, an imidazole group, an oxazole group, a thiazole group, a pyrazole group, an isoxazole group, an isothiazole group, and a pyridine group. These heterocyclic compounds may be used singly or in combination of two or more species.

(Solvent)

The above-mentioned composition contains a solvent. Examples of the solvent include ethylene glycol monomethyl ether, ethylene glycol mono ethylether, diethylene glycol monomethyl ether, diethylene glycol monoethyl ether, propylene glycol, propylene glycol monomethyl ether, propylene glycol monopropyl ether, propylene glycol monomethyl ether acetate, propylene glycol propyl ether acetate, methylcellosolve acetate, ethylcellosolve acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. These solvents may be used singly or in combination of two or more species.

The lower limit of the solid content (the net amount of the composition not including the solvent) is, for example, 0.1 mass % or higher, 0.5 mass % or higher, or 0.8 mass % or higher. The upper limit is, for example, 70 mass % or lower, 50 mass % or lower, or 30 mass % or lower. The total polymer content of the solid is 1 to 100 mass %, 20 to 99.9 mass %, or 50 to 99.9 mass %.

(Other Components: Cross-Linking Agents)

In addition to the above polymer and the solvent, the composition may also contain other components (e.g., a cross-linking agent, an acidic compound, an acid-generator, a surfactant, and an additional polymer).

Examples of the cross-linking agent include 4,4'-(1-methylethylidine)bis[2,6-bis[(2-methoxy-1-methylethoxy)methyl]-phenol, methoxymethylated glycol uryl, butoxymethylated glycol uryl, methoxymethylated melamine, butoxymethylated malamine, methoxymethylated benzoguanamine, butoxymethylated benzoguanamine, methoxymethylated urea, butoxymethylated urea, and methoxymethylated thiourea. Condensed derivatives of any of these compounds may also be used. These compounds may be used singly or in combination of two or more species.

The cross-linking agent content of the solid component of the composition is, for example, 80 mass % or less, 60 mass % or less, or 40 mass % or less.

(Other Components: Acidic Compound and/or Acid-Generator)

The acidic compound and/or acid-generator serve as a catalyst which can accelerate cross-linking reaction. Examples of the acidic compound include p-toluenesulfonic acid, trifluoromethanesulfonic acid, pyridinium p-phenolsulfonate, salicylic acid, sulfosalcicylic acid, citric acid, benzoic acid, hydroxybenzoic acid, and naphthalenecarboxylic acid. These acidic compounds may be used singly or in combination of two or more species.

Examples of the acid-generator include 2,4,4,6-tetrabromocyclohexadienone, benzoin tosylate, 2-nitrobenzyl tosylate, other organic sulfonate alkyl esters, trifluoromethanesulfonic acid, a quaternary ammonium salt, and 3,3',5,5'-tetramethoxymethyl-4,4'-dihydroxybiphenyl (TMOM-BP, product of Honshu Chemical Industry Co., Ltd.). These acid-generators may be used singly or in combination of two or more species.

The acidic compound content and/or the thermo-acid-generator content of the solid of the composition is, for example, 20 mass % or less or 10 mass % or less.

(Other Components: Surfactant)

Examples of the surfactant include, as nonionic surfactants, polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenyl ether and polyoxyethylene nonyl phenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; as fluorine-containing surfactants such as F Top EF301, EF303, and EF352 (products of Mitsubishi Materials Electronic Chemicals Co., Ltd.), Megaface F171, F173, R-30, and R-30-N (products of DIC Corporation), Fluorad FC430 and FC431 (products of Sumitomo 3M Ltd.), AsahiGurad AG710 and Surflon S-382, SC101, SC102, SC103, SC104, SC105, and SC106 (products of AGC Inc.); and organosiloxane polymer KP341 (product of Shin-Etsu Chemical Co., Ltd.). These surfactants may be used singly or in combination of two or more species.

The surfactant content of the solid of the composition is, for example, 5 mass % or less, 2 mass % or less, or 1 mass % or less.

(Other Components: Additional Polymer)

Examples of the additional polymer include polyacrylate ester compounds, polymethacrylate ester compounds, polyacrylamide compounds, polymethacrylamide compounds, polyvinyl compounds, polystyrene compounds, polymaleimide compounds, polymaleic anhydrides, and polyacrylonitrile compounds.

The additional polymer content with respect to the entire amount of the polymer in the composition is 30 mass % or less or 10 mass % or less.

The thus-prepared composition may be suitably purified through re-precipitation by use of an organic solvent such as methanol. Also, if needed, the composition may be dried by means of a vacuum drier or the like. The composition can be prepared by dissolving the aforementioned components in a solvent, and is used as a uniform solution. The thus-prepared composition is preferably filtered through, for example, a filter (pore size: 0.02 μm), before use thereof.

<Resist Underlayer Film and Production Method Therefor>

The resist underlayer film according to this embodiment is a baked product of a coating film containing the aforementioned composition. The resist underlayer film production method according to this embodiment includes a step of applying, onto a substrate, the composition, to thereby form a coating film, and a step of baking the coating film.

An example of the substrate is a so-called semiconductor substrate (e.g., a silicon wafer or a germanium wafer which may be coated with silicon oxide film, silicon nitride film, or silicon oxide nitride film). No particular limitation is imposed on the application technique, and spin coating, printing, an ink-jet technique, etc. may be employed.

The temperature and time of baking may be set to favorable conditions. For example, in order to thoroughly remove the solvent contained in the composition, the baking temperature is 150° C. to 600° C., or 350° C. to 450° C., and the baking time is 0.5 minutes to 5 minutes, or 1 minute to 3 minutes.

The thickness of the resist underlayer film may be appropriately modified in accordance with the application of the resist underlayer film or the like. The thickness is, for example, 50 nm or more or 100 nm or more, and 1,000 nm or less or 500 nm or less.

<Patterned Substrate Production Method and Semiconductor Device Production Method>

The patterned substrate production method according to this embodiment includes a step of forming a resist underlayer film on a substrate by use of the composition; a step of forming a specific hard mask on the resist underlayer film; a step of forming a photoresist film on the hard mask; a step of forming a resist pattern through light exposure to and development of the photoresist film; a step of mask-patterning by etching the hard mask through the resist pattern; a step of forming a resist underlayer pattern by etching the resist underlayer film through the mask pattern; and a step of processing the substrate through the resist underlayer pattern. The semiconductor device production method according to this embodiment includes a step of applying the composition onto a substrate; a step of etching the resist underlayer film through a specific pattern, and a step of processing the substrate through the patterned resist underlayer film (i.e., resist underlayer pattern).

An example of the hard mask is a silicon hard mask containing silicon. No particular limitation is imposed on the method for forming the hard mask, and one adaptable technique includes applying a material containing a silicon component onto a resist underlayer film. In an alternative technique, a hard mask is vapor-deposited on a resist underlayer film.

The photoresist film may be formed through a customary method; i.e., applying a photoresist solution onto a hard mask to form a coating film, and baking the coating film.

The photoresist solution contains a composition for forming the photoresist film, and a solvent for dissolving the composition. Examples of the solvent include ethyl lactate, propylene glycol monomethyl ether, propylene glycol monomethyl ether acetate, and cyclohexanone. The photoresist solution to be used is photosensitive to the light source employed in light exposure. Light exposure may be performed through any of light and electron beams. No particular limitation is imposed on the developer used in the development stage.

In etching of the hard mask through the resist pattern, a halogen-containing gas such as $CF_4$ may be used. Also, an oxygen-containing gas or a hydrogen-containing gas may be used in etching of the resist underlayer film through the masking pattern. In processing of the substrate through patterning of the resist under layer (i.e., etching), a halogen-containing gas such as $CF_4$ may be used.

As described above, the resist underlayer film obtained from the aforementioned composition exhibits high etching resistance to an etching gas, for example, a halogen-containing gas. Thus, the target substrate can be suitably processed according to the resist underlayer pattern. In addition, even when an oxygen-containing or hydrogen-containing gas, having an etching selectivity different from that of the halogen-containing gas, is used, the resist underlayer film itself can be suitably etched. That is, the resist underlayer pattern is favorably formed through etching with an oxygen-containing or hydrogen-containing gas.

EXAMPLES

The present invention will next be described by way of Examples and Comparative Examples. However, the present invention should not be limited by the following description.

In Synthesis Examples 1 to 3 and Comparative Synthesis Examples 1 and 2, the weight average molecular weight (Mw) as reduced to polystyrene and the polydispersity (Mw/Mn) were determined through gel permeation chromatography (GPC). The chromatographic measurement was performed by means of a GPC (product of Tosoh Corp.) under the following conditions. GPC column: TSKgel SuperMultipore (registered trademark) Hz-N (product of Tosoh)

Column temperature: 40° C.

Solvent: tetrahydrofuran (THF)

Flow rate: 0.35 mL/min

Standard sample: polystyrene (product of Tosoh)

The following abbreviations are employed in the Examples and Comparative Examples.

DPM: benzhydrol

TPM: triphenylmethanol

DP: 1,1-diphenyl-2-propyn-1-ol

TP: 1,1,3-triphenyl-2-propyn-1-ol

FLO: 9-fluorenol

[F34]

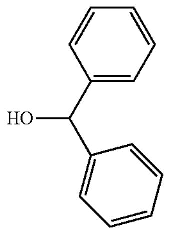

(DPM)

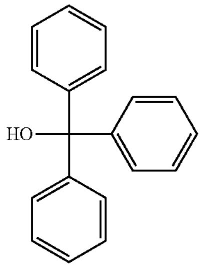

(TPM)

-continued

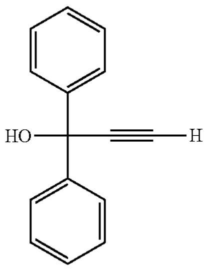

(DP)

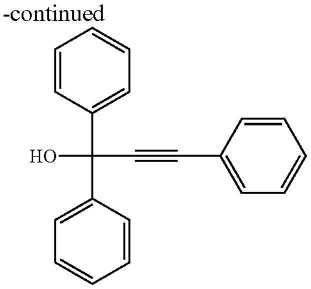

(TP)

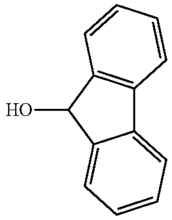

(FLO)

PGME: propylene glycol monomethyl ether

PGMEA: propylene glycol monomethyl ether acetate

<Synthesis of Polymers>

Synthesis Example 1

Under nitrogen, 1,3-bis[2-(4-hydroxyphenyl)-2-propyl]benzene (BPM) (10.00 g, 0.0289 mol, product of Tokyo Chemical Industry Co., Ltd.), 1-pyrenecarboxyaldehyde (Py) (6.646 g, 0.0289 mol, product of Aldrich), and methanesulfonic acid (0.5548 g, 0.0058 mol, product of Tokyo Chemical Industry Co., Ltd.) were added to a four-neck flask (300 mL). Then, PGME (7.74 g, product of Kanto Chemical Co., Inc.) and PGMEA (18.06 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature, and TMP (3.76 g, 0.0144 mol, product of Tokyo Chemical Industry Co., Ltd.) and methanesulfonic acid (0.2774 g, 0.0029 mol, product of Tokyo Chemical Industry Co., Ltd.) were added thereto. Then, PGME (1.82 g, product of Kanto Chemical Co., Inc.) and PGMEA (4.24 g, product of Kanto Chemical Co., Inc.) were fed to the flask. The mixture was heated to 120° C. under stirring, to thereby dissolve it and initiate polymerization reaction. The polymerization reaction was terminated 23 hours after initiation of reaction. Subsequently, the product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 16.12 g of a polymer (BPM-Py-TPM). The thus-obtained BPM-Py-TPM was found to have a weight average molecular weight (Mw) of 18,260 and a polydispersity (Mw/Mn) of 12.85.

Synthesis Example 2

Under nitrogen, 1,3-bis[2-(4-hydroxyphenyl)-2-propyl]benzene (10.00 g, 0.0289 mol, product of Tokyo Chemical Industry Co., Ltd.), 1-pyrenecarboxyaldehyde (6.646 g, 0.0289 mol, product of Aldrich), and methanesulfonic acid (0.5548 g, 0.0058 mol, product of Tokyo Chemical Industry Co., Ltd.) were added to a four-neck flask (300 mL). Then, PGME (7.74 g, product of Kanto Chemical Co., Inc.) and PGMEA (18.06 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature, and DP (3.01 g, 0.0144 mol, product of Tokyo Chemical Industry Co., Ltd.) and methanesulfonic acid (0.2774 g, 0.0029 mol, product of Tokyo Chemical Industry Co., Ltd.) were added thereto. Then, PGME (1.82 g, product of Kanto Chemical Co., Inc.) and PGMEA (4.24 g, product of Kanto Chemical Co., Inc.) were fed to the flask. The mixture was heated to 120° C. under stirring, to thereby dissolve it and initiate polymerization reaction. The polymerization reaction was terminated 23 hours after initiation of reaction. Subsequently, the product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 13.56 g of a polymer (BPM-Py-DP). The thus-obtained BPM-Py-DP was found to have a weight average molecular weight (Mw) of 22,380 and a polydispersity (Mw/Mn) of 12.61.

Synthesis Example 3

Under nitrogen, 1,3-bis[2-(4-hydroxyphenyl)-2-propyl] benzene (10.00 g, 0.0289 mol, product of Tokyo Chemical Industry Co., Ltd.), 1-pyrenecarboxyaldehyde (6.646 g, 0.0289 mol, product of Aldrich), and methanesulfonic acid (0.5548 g, 0.0058 mol, product of Tokyo Chemical Industry Co., Ltd.) were added to a four-neck flask (300 mL). Then, PGME (7.74 g, product of Kanto Chemical Co., Inc.) and PGMEA (18.06 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature, and TP (4.10 g, 0.0144 mol, product of Tokyo Chemical Industry Co., Ltd.) and methanesulfonic acid (0.2774 g, 0.0029 mol, product of Tokyo Chemical Industry Co., Ltd.) were added thereto. Then, PGME (1.82 g, product of Kanto Chemical Co., Inc.) and PGMEA (4.24 g, product of Kanto Chemical Co., Inc.) were fed to the flask. The mixture was heated to 120° C. under stirring, to thereby dissolve it and initiate polymerization reaction. The polymerization reaction was terminated 23 hours after initiation of reaction. Subsequently, the product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 13.48 g of a polymer (BPM-Py-TP). The thus-obtained BPM-Py-TP was found to have a weight average molecular weight (Mw) of 3,490 and a polydispersity (Mw/Mn) of 2.50.

Synthesis Example 4

Under nitrogen, 1,3-bis[2-(4-hydroxyphenyl)-2-propyl] benzene (10.00 g, 0.0289 mol, product of Tokyo Chemical Industry Co., Ltd.), 1-pyrenecarboxyaldehyde (6.646 g, 0.0289 mol, product of Aldrich), and methanesulfonic acid (0.5548 g, 0.0058 mol, product of Tokyo Chemical Industry Co., Ltd.) were added to a four-neck flask (300 mL). Then, PGME (7.74 g, product of Kanto Chemical Co., Inc.) and PGMEA (18.06 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature, and FLO (2.63 g, 0.0144 mol, product of Tokyo Chemical Industry Co., Ltd.) and methanesulfonic acid (0.2774 g, 0.0029 mol, product of Tokyo Chemical Industry Co., Ltd.) were added thereto. Then, PGME (1.82 g, product of Kanto Chemical Co., Inc.) and PGMEA (4.24 g, product of Kanto Chemical Co., Inc.) were fed to the flask. The mixture was heated to 120° C. under stirring, to thereby dissolve it and initiate polymerization reaction. The polymerization reaction was terminated 23 hours after initiation of reaction. Subsequently, the product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 14.07 g of a polymer (BPM-Py-FLO). The thus-obtained BPM-Py-FLO was found to have a weight average molecular weight (Mw) of 6,720 and a polydispersity (Mw/Mn) of 3.11.

Synthesis Example 5

Under nitrogen, 1,3-bis[2-(4-hydroxyphenyl)-2-propyl] benzene (10.00 g, 0.0289 mol, product of Tokyo Chemical Industry Co., Ltd.), 1-pyrenecarboxyaldehyde (6.646 g, 0.0289 mol, product of Aldrich), and methanesulfonic acid (0.5548 g, 0.0058 mol, product of Tokyo Chemical Industry Co., Ltd.) were added to a four-neck flask (300 mL). Then, PGME (7.74 g, product of Kanto Chemical Co., Inc.) and PGMEA (18.06 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature, and DPM (2.66 g, 0.0144 mol, product of Tokyo Chemical Industry Co., Ltd.) and methanesulfonic acid (0.2774 g, 0.0029 mol, product of Tokyo Chemical Industry Co., Ltd.) were added thereto. Then, PGME (1.82 g, product of Kanto Chemical Co., Inc.) and PGMEA (4.24 g, product of Kanto Chemical Co., Inc.) were fed to the flask. The mixture was heated to 120° C. under stirring, to thereby dissolve it and initiate polymerization reaction. The polymerization reaction was terminated 23 hours after initiation of reaction. Subsequently, the product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 12.16 g of a polymer (BPM-Py-DPM). The thus-obtained BPM-Py-DPM was found to have a weight average molecular weight (Mw) of 15,080 and a polydispersity (Mw/Mn) of 12.11.

Synthesis Example 6

Under nitrogen, 2-phenylindole (8.00 g, 0.0414 mol, product of Tokyo Chemical Industry Co., Ltd.), 1-pyrenecarboxyaldehyde (9.533 g, 0.0414 mol, product of Aldrich), TMP (4.31 g, 0.0166 mol, product of Tokyo Chemical Industry Co., Ltd.), and methanesulfonic acid (1.6711 g, 0.0166 mol, product of Tokyo Chemical Industry Co., Ltd.) were added to a four-neck flask (300 mL). Then, PGME (16.46 g, product of Kanto Chemical Co., Inc.) and PGMEA (38.41 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 16.38 g of a polymer (Pid-Py-TPM). The thus-obtained Pid-Py-TPM was found to have a weight average molecular weight (Mw) of 780 and a polydispersity (Mw/Mn) of 2.00.

Synthesis Example 7

Under nitrogen, 1-phenyl-2-naphtylamine (8.00 g, 0.0365 mol, product of Tokyo Chemical Industry Co., Ltd.), 1-pyrenecarboxyaldehyde (8.406 g, 0.0365 mol, product of Aldrich), TMP (3.80 g, 0.0146 mol, product of Tokyo Chemical Industry Co., Ltd.), and methanesulfonic acid (1.4727 g, 0.0153 mol, product of Tokyo Chemical Industry Co., Ltd.) were added to a four-neck flask (300 mL). Then, 1,4-dioxane (32.51 g, product of Kanto Chemical Co., Inc.) was fed to the flask. The mixture was heated to 120° C. under stirring, to thereby dissolve it and initiate polymerization reaction. The polymerization reaction was terminated 20 hours after initiation of reaction. The product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 16.36 g of a polymer (PNA-Py-TPM). The thus-obtained PNA-Py-TPM was found to have a weight average molecular weight (Mw) of 1,495 and a polydispersity (Mw/Mn) of 2.63.

Comparative Synthesis Example 1

Under nitrogen, 1,3-bis[2-(4-hydroxyphenyl)-2-propyl]benzene (10.00 g, 0.0289 mol, product of Tokyo Chemical Industry Co., Ltd.), 1-pyrenecarboxyaldehyde (6.646 g, 0.0289 mol, product of Aldrich), and methanesulfonic acid (0.5548 g, 0.0058 mol, product of Tokyo Chemical Industry Co., Ltd.) were added to a four-neck flask (300 mL). Then, PGME (7.74 g, product of Kanto Chemical Co., Inc.) and PGMEA (18.06 g, product of Kanto Chemical Co., Inc.) were fed to the flask. The mixture was heated to 120° C. under stirring, to thereby dissolve it and initiate polymerization reaction. The polymerization reaction was terminated 24 hours after initiation of reaction. The product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 10.82 g of a polymer (BPM-Py). The thus-obtained BPM-Py was found to have a weight average molecular weight (Mw) of 6,300 and a polydispersity (Mw/Mn) of 1.90.

Comparative Synthesis Example 2

Under nitrogen, 2-phenylindol (Pid) (8.00 g, 0.0414 mol, product of Tokyo Chemical Industry Co., Ltd.), 1-pyrenecarboxyaldehyde (9.533 g, 0.0414 mol, product of Aldrich), and methanesulfonic acid (1.1937 g, 0.0124 mol, product of Tokyo Chemical Industry Co., Ltd.) were added to a four-neck flask (300 mL). Then, PGME (13.11 g, product of Kanto Chemical Co., Inc.) and PGMEA (30.59 g, product of Kanto Chemical Co., Inc.) were fed to the flask. The mixture was heated to 120° C. under stirring, to thereby dissolve it and initiate polymerization reaction. The polymerization reaction was terminated 20 hours after initiation of reaction. The product was allowed to cool to room temperature and reprecipitated in methanol (500 g, product of Kanto Chemical Co., Inc.). The precipitated matter was separated through filtration and dried at 50° C. for 10 hours by means of a vacuum drier, to thereby yield 16.38 g of a polymer (Pid-Py). The thus-obtained Pid-Py was found to have a weight average molecular weight (Mw) of 880 and a polydispersity (Mw/Mn) of 1.69.

<Preparation of Resist Underlayer Film-Forming Compositions>

Example 1

The polymer produced in Synthesis Example 1 (20 g) was mixed with Megaface R-30N (product of DIC Corporation) (0.06 g) as a surfactant. The mixture was dissolved in PGME (24 g) and PGMEA (66 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Example 2

The polymer produced in Synthesis Example 2 (20 g) was mixed with Megaface R-30N (product of DIC Corporation) (0.06 g) as a surfactant. The mixture was dissolved in PGME (24 g) and PGMEA (66 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Example 3

The polymer produced in Synthesis Example 3 (20 g) was mixed with Megaface R-30N (product of DIC Corporation) (0.06 g) as a surfactant. The mixture was dissolved in PGME (24 g) and PGMEA (66 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Example 4

The polymer produced in Synthesis Example 4 (20 g) was mixed with Megaface R-30N (product of DIC Corporation) (0.06 g) as a surfactant. The mixture was dissolved in PGME (24 g) and PGMEA (66 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Example 5

The polymer produced in Synthesis Example 5 (20 g) was mixed with Megaface R-30N (product of DIC Corporation)

(0.06 g) as a surfactant. The mixture was dissolved in PGME (24 g) and PGMEA (66 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Example 6

The polymer produced in Synthesis Example 6 (1.227 g) was mixed with 4,4'-(1-methylethylidine)bis[2,6-bis[(2-methoxy-1-methylethoxy)methyl]-phenol (0.184 g) as a cross-linking agent, pyridinium p-phenolsulfonate (0.018 g) as an acidic compound, and Megaface R-30N (product of DIC Corporation) (0.0012 g) as a surfactant. The mixture was dissolved in PGME (3.53 g), PGMEA (3.53 g), and cyclohexanone (10.58 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Example 7

The polymer produced in Synthesis Example 7 (1.227 g) was mixed with 4,4'-(1-methylethylidine)bis[2,6-bis[(2-methoxy-1-methylethoxy)methyl]-phenol (0.184 g) as a cross-linking agent, pyridinium p-phenolsulfonate (0.018 g) as an acidic compound, and Megaface R-30N (product of DIC Corporation) (0.0012 g) as a surfactant. The mixture was dissolved in PGME (3.53 g), PGMEA (3.53 g), and cyclohexanone (10.58 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Comparative Example 1

The polymer produced in Comparative Synthesis Example 1 (20 g) was mixed with Megaface R-30N (product of DIC Corporation) (0.06 g) as a surfactant. The mixture was dissolved in PGME (24 g) and PGMEA (66 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Comparative Example 2

The polymer produced in Comparative Synthesis Example 2 (1.227 g) was mixed with 3,3',5,5'-tetramethoxymethyl-4,4'-dihydroxybiphenyl (TMOM-BP, product of Honshu Chemical Industry Co., Ltd.) (0.184 g) as an acid-generator, pyridinium p-phenolsulfonate (0.018 g) as an acidic compound, and Megaface R-30N (product of DIC Corporation) (0.0012 g) as a surfactant. The mixture was dissolved in PGME (3.53 g), PGMEA (3.53 g), and cyclohexanone (10.58 g). Subsequently, the product was filtered sequentially through a polyethylene microfilter (pore size: 0.10 μm) and a polyethylene microfilter (pore size: 0.05 μm), to thereby prepare a resist underlayer film-forming composition.

Examples 1A to 7A, and Comparative Examples 1A and 2A

Each of the resist underlayer film-forming compositions prepared in Examples 1 to 7 and Comparative Examples 1 and 2 was applied onto a silicon wafer by means of a spin coater. The coated wafer was baked with a hot plate at 400° C. for 90 seconds, to thereby form a resist underlayer film (film thickness: 0.25 μm).

<Photoresist Solvent Elution Test>

Each of the resist underlayer films formed in Examples 1A to 7A and Comparative Examples 1A and 2A was immersed in a solvent employable in a photoresist solution, specifically, each of ethyl lactate, propylene glycol monomethyl ether, propylene glycol monomethyl ether acetate, and cyclohexanone. The test has revealed that all the films are insoluble in the tested solvents. The solubility (or insolubility) was determined on the basis of the change in film thickness as measured before and after the elution test.

<Measurement of Dry Etching Rate>

The following etcher and etching gas were used in the measurement of dry etching rate.

Etcher: ES401 (product of Nippon Scientific Co., Ltd.)

Etching gas: $CF_4$

The dry etching rate (speed) of each of the resist underlayer films formed in Examples 1A to 7A and Comparative Examples 1A and 2A was determined by use of a halogen-containing etching gas (specifically $CF_4$) as an etching gas. The decrease in film thickness per unit time (1 minute) with respect to each resist underlayer film was calculated as a dry etching rate. Table 1 shows the results. The smaller the dry etching rate, the higher the etching resistance to $CF_4$ gas.

TABLE 1

| | Decrease in film thickness per unit time (Å/min) |
|---|---|
| Ex. 1A | 79.4 |
| Ex. 2A | 78.2 |
| Ex. 3A | 78.2 |
| Ex. 4A | 78.2 |
| Ex. 5A | 79.4 |
| Ex. 6A | 73.5 |
| Ex. 7A | 76.1 |
| Comp. Ex. 1A | 81.6 |
| Comp. Ex. 2A | 84.9 |

The resist underlayer films formed in Examples 1A to 7A have high etching resistance to $CF_4$ gas. Thus, the films are expected to exhibit a higher dry etching rate with respect to an oxygen-based or hydrogen-based gas (having an etching selectivity differing from that of a halogen-containing etching gas), as compared with the resist underlayer films formed in Comparative Examples 1A and 2A.

<Chemical Liquid Mixing Test>

Each of the resist underlayer film-forming compositions prepared in Examples 1 to 7 and Comparative Examples 1 and 2 was mixed with methyl 2-hydroxyisobutyrate at a weight ratio of 9:1. The presence of precipitates in the mixture was checked. Table 2 shows the results. The precipitates were visually observed and confirmed. When the solution was transparent, the test score was "no precipitation," whereas when the solution contained insoluble matter, the test score was "precipitation."

TABLE 2

| | Presence of precipitation after mixing |
|---|---|
| Ex. 1 | no precipitation |
| Ex. 2 | no precipitation |
| Ex. 3 | no precipitation |

TABLE 2-continued

| | Presence of precipitation after mixing |
|---|---|
| Ex. 4 | no precipitation |
| Ex. 5 | no precipitation |
| Ex. 6 | no precipitation |
| Ex. 7 | no precipitation |
| Comp. Ex. 1 | precipitation |
| Comp. Ex. 2 | precipitation |

The invention claimed is:

1. A resist underlayer film-forming composition containing a polymer, wherein the polymer is a novolak resin having a structure in which an addition unit having a group represented by the following formula (1) is bound to any of the rings of a formed novolak resin:

(1)

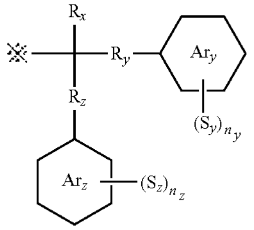

wherein each $R_x$ represents a monovalent organic group that has 2 to 20 carbon atoms and optionally includes at least one of a nitrogen atom, an oxygen atom, and a sulfur atom, and comprises a cyclic skeleton having from 2 to 5 and 7 to 20 carbon atoms, a linear-chain skeleton, or a branched-chain skeleton;

each of $S_y$ and $S_z$ represents a hydrogen atom or a monovalent organic group that has 2 to 20 carbon atoms and optionally includes at least one of a nitrogen atom, an oxygen atom, and a sulfur atom, and comprises a cyclic skeleton having from 2 to 5 and 7 to 20 carbon atoms, a linear-chain skeleton, or a branched-chain skeleton;

each of $R_y$ and $R_z$ represents a single bond or a divalent organic group;

each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween;

$n_y$ is an integer of 0 to the maximum number corresponding to allowable substitution to ring $Ar_y$;

$n_z$ is an integer of 0 to the maximum number corresponding to allowable substitution to ring $Ar_z$; and

* is a novolak resin bonding site; and wherein the polymer includes at least one of a unit represented by the following formula (1a) and a unit represented by the following formula (1b):

(1a)

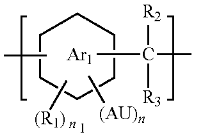

-continued (1b)

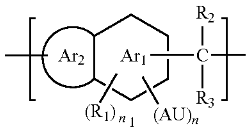

wherein each of AU represents a group represented by formula (1);

each of $R_1$ represents a halogen group, a nitro group, an amino group, a hydroxyl group, a glycidyl ether group, an aromatic hydrocarbyl group, a C1 to C10 alkyl group, or a C2 to C10 alkenyl group and may include at least one of an ether group, a ketone group, and an ester group;

each of $R_2$ represents a hydrogen atom or a heterocyclic group;

each of $R_3$ represents a hydrogen atom, an aromatic hydrocarbyl group, a heterocyclic group, a C1 to C10 alkyl group, or a C2 to C10 alkenyl group, wherein each of the aromatic hydrocarbyl group and the heterocyclic group of $R_2$ and $R_3$ may have at least one substituent selected from among the group consisting of a halogen group, a nitro group, an amino group, a formyl group, a carboxyl group, an alkyl carboxylate ester group, a hydroxyl group, a C1 to C10 alkyl group, a C1 to C10 alkoxy group, and a C6 to C40 aryl group;

provided that $R_2$ and $R_3$ are not both a hydrogen atom;

$R_2$ and $R_3$ may be linked together to form a ring structure;

each ring $Ar_1$ represents a benzene ring, a naphthalene ring, or an anthracene ring;

ring $Ar_2$ is a heterocyclic ring;

each n is an integer of ≥1;

each $n_1$ is an integer of ≥0; and each $n+n_1$ is an integer of 1 to the maximum number corresponding to allowable substitution to ring $Ar_1$;

wherein when $R_3$ represents an aromatic hydrocarbyl group or $R_2$ represents a heterocyclic group, the polymer is a novolak resin that is produced through polymerization by use of, as raw materials, an aldehyde and/or a ketone, and at least one member of a bisphenol, an amine, and a heterocyclic compound, in which the aldehyde is selected from the group consisting of an aromatic aldehyde, and a heterocyclic aldehyde; and the aromatic aldehyde is selected the group consisting of 1-pyrenecarboxyaldehyde, naphthaldehyde, anthracenecarboxyaldehyde, anisaldehyde, terephthaldehyde, anthrylaldehyde, phenanthrylaldehyde, salicylaldehyde, phenylacetaldehyde, 3-phenylpropionaldehyde, tolylaldehyde, (N,N-dimethylamino) benzaldehyde, and acetoxybenzaldehyde; the heterocyclic aldehyde is selected the group consisting of furfural, pyridinecarboxyaldehyde, and thiophenecarboxyaldehyde;

the aromatic ketone is selected the group consisting of diphenyl ketone, phenyl naphthyl ketone, dinaphthyl ketone, phenyl tolyl ketone, ditolyl ketone, and 9-fluorenone; and the bisphenol is selected from the group consisting of 1,3-bis[2-(4-hydroxyphenyl)-2-propyl]benzene, 2-phenylindole, 1-phenyl-2-naphthylamine, and 1,4-bis[2-(4-hydroxyphenyl)-2-propyl]benzene.

2. The resist underlayer film-forming composition according to claim 1, wherein at least one of ring $Ar_y$ and ring $Ar_z$ includes a C6 to C30 aryl group.

3. The resist underlayer film-forming composition according to claim 1, wherein the polymer is a novolak resin having a structure in which the addition unit has a group represented by the following formulas (1-3), (1-10) to (1-12), and (1-14) bound to any of the rings of the formed novolak resin:

(1-3)

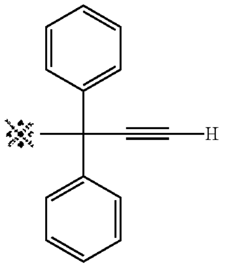

(1-10)

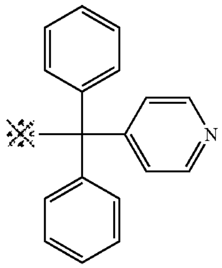

(1-11)

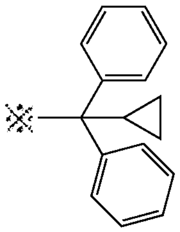

(1-12)

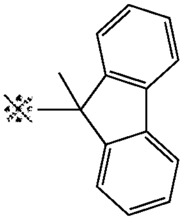

(1-14)

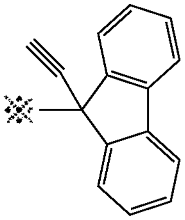

Wherein * is a novolak resin bonding site.

4. A resist underlayer film-forming composition containing a polymer, wherein the polymer is a novolak resin having a structure in which a formed novolak resin includes a unit represented by the following formula (1a-1) and/or a unit represented by the following formula (1a-2), and an addition unit having a group represented by the following formula (1) is bound to any of the rings of the formed novolak resin:

(1)

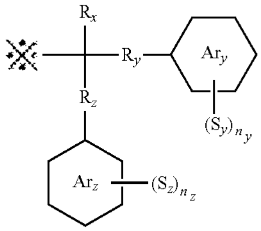

wherein each $R_x$ represents a monovalent organic group that has 2 to 20 carbon atoms and optionally includes at least one of a nitrogen atom, an oxygen atom, and a sulfur atom, and comprises a cyclic skeleton having from 2 to 5 and 7 to 20 carbon atoms, a linear-chain skeleton, or a branched-chain skeleton;

each of $S_y$ and $S_z$ represents a hydrogen atom or a monovalent organic group that has 2 to 20 carbon atoms and optionally includes at least one of a nitrogen atom, an oxygen atom, and a sulfur atom, and comprises a cyclic skeleton having from 2 to 5 and 7 to 20 carbon atoms, a linear-chain skeleton, or a branched-chain skeleton;

each of $R_y$ and $R_z$ represents a single bond or a divalent organic group;

each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween;

$n_y$ is an integer of 0 to the maximum number corresponding to allowable substitution to ring $Ar_y$;

$n_z$ is an integer of 0 to the maximum number corresponding to allowable substitution to ring $Ar_z$; and

* is a novolak resin bonding site;

(1a-1)

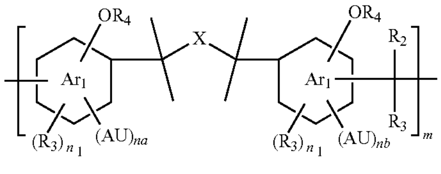

-continued (1a-2)

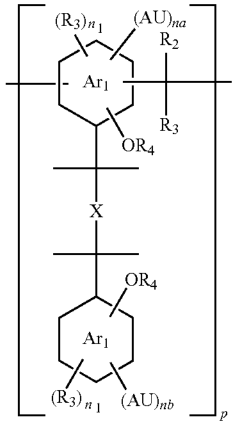

wherein each of AU represents a group represented by formula (1);

each of $R_1$ represents a halogen group, a nitro group, an amino group, an aromatic hydrocarbyl group, a C1 to C10 alkyl group, or a C2 to C6 alkenyl group;

each of $R_2$ represents an aromatic hydrocarbyl group or a heterocyclic group;

each of $R_3$ represents a hydrogen atom, a phenyl group, or a naphthyl group;

when each of $R_2$ and $R_3$ is a phenyl group, they may be linked together to form a fluorene ring;

each of $R_4$ represents a hydrogen atom, an acetal group, an acyl group, a glycidyl group, a C1 to C10 alkyl group, or a C2 to C6 alkenyl group;

ring $Ar_1$ is a benzene ring;

each of X is a benzene ring, and two $—C(CH_3)_2—$ groups bonding to the benzene ring are in m- or p-relation;

each of $n_1$ is 0 or 1;

the sum $n_a$+$n_b$ is independently an integer of ≥1; and each of the sum $n_a$+$n_1$ and the sum $n_b$+$n_1$ is an integer of 0 to the maximum number corresponding to allowable substitution to ring $Ar_1$; and the unit represented by the formula (1a-1) and/or a unit represented by the following formula (1a-2) is selected from the group consisting of the following (in which the group represented by formula (1) is omitted, and the polymer that includes the unit represented by the formula (1a-1) and/or a unit represented by the formula (1a-2) is formed through bonding of the group represented by the formula (1) to any of the rings of the following):

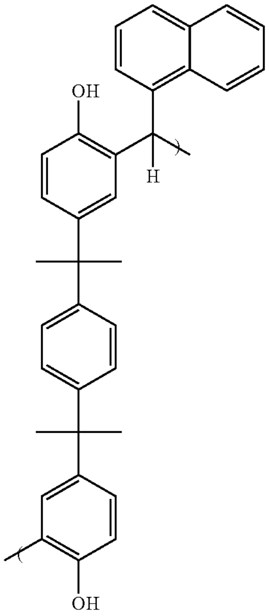

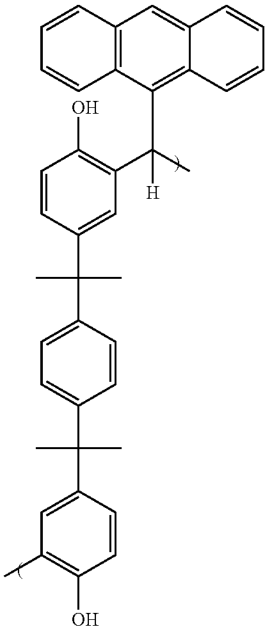

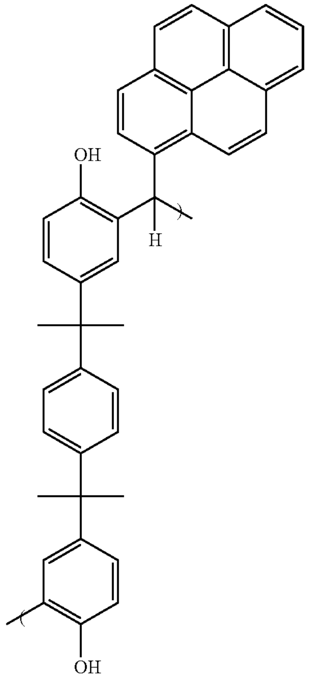

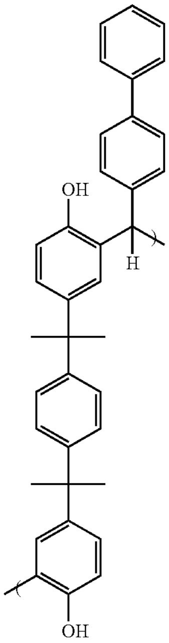

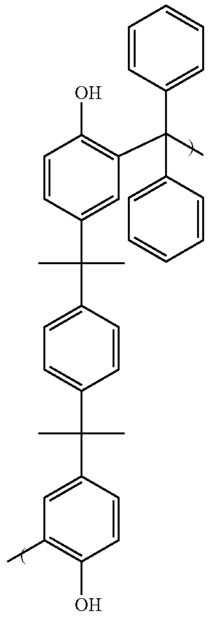
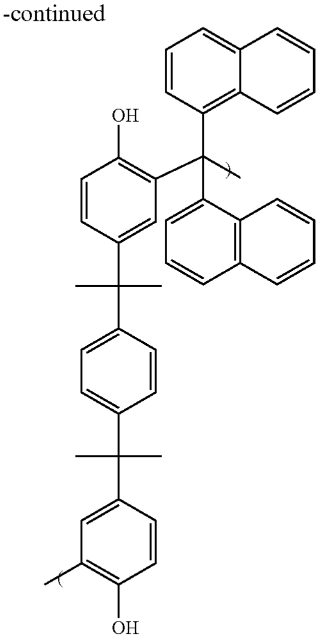
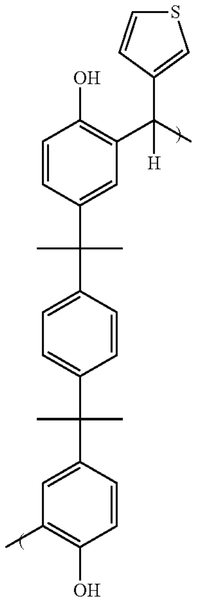
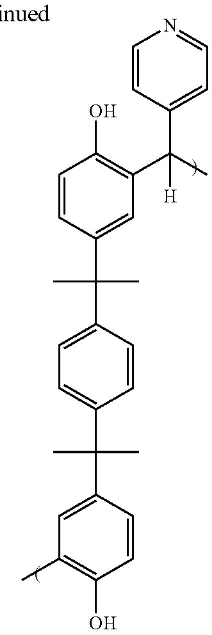
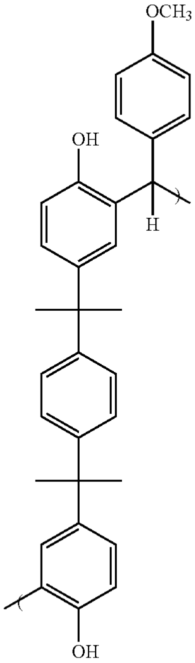
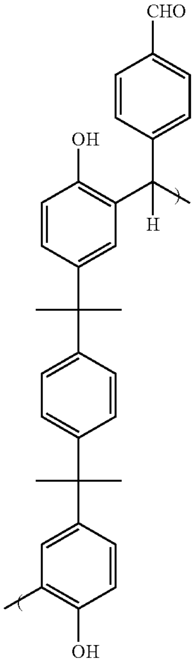
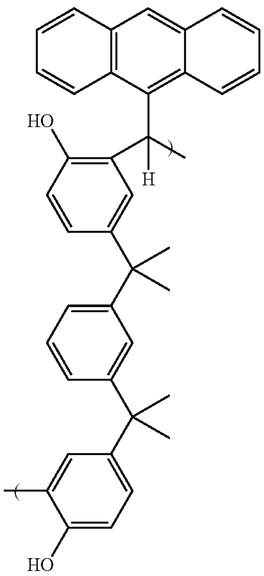
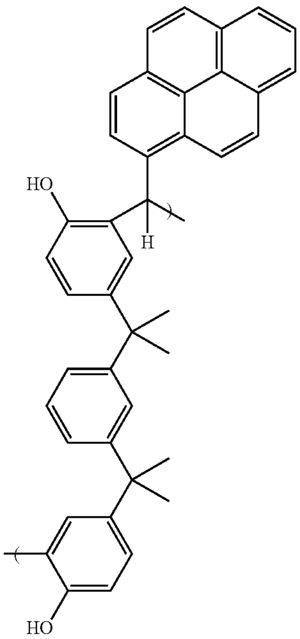

-continued
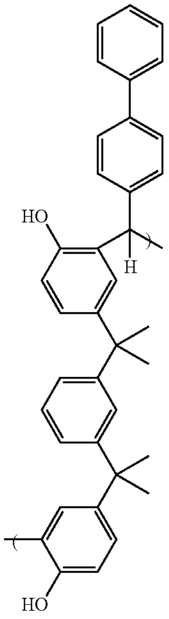
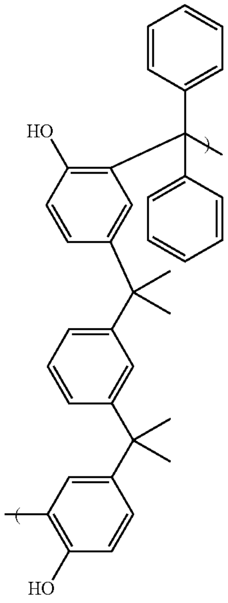
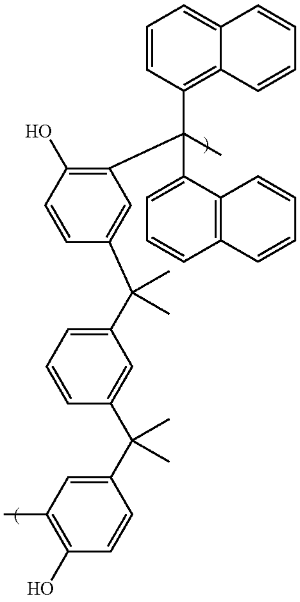
-continued
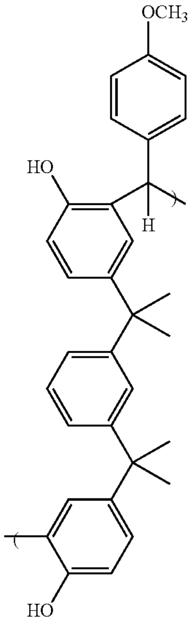
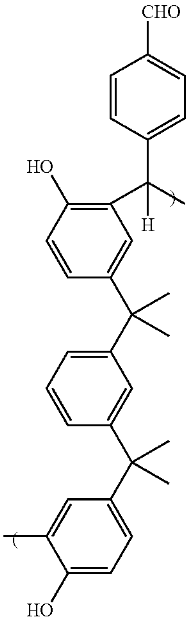
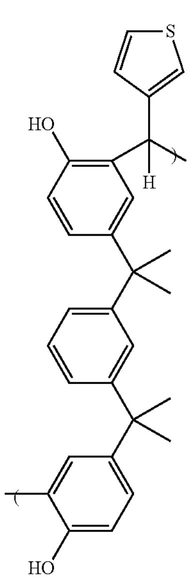
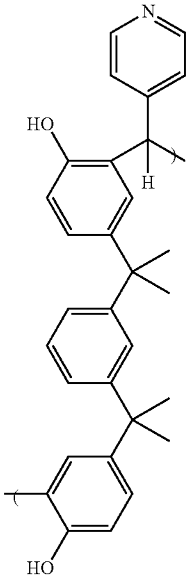

-continued
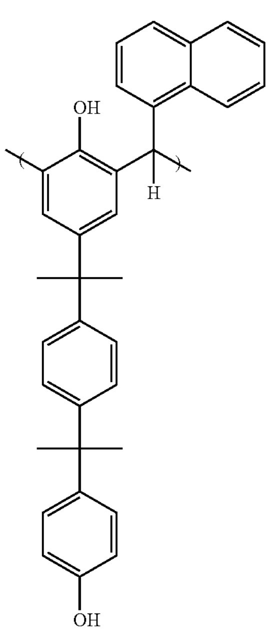
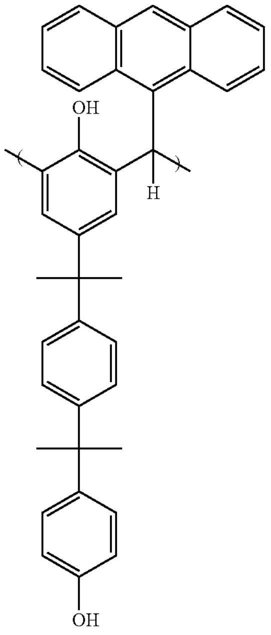
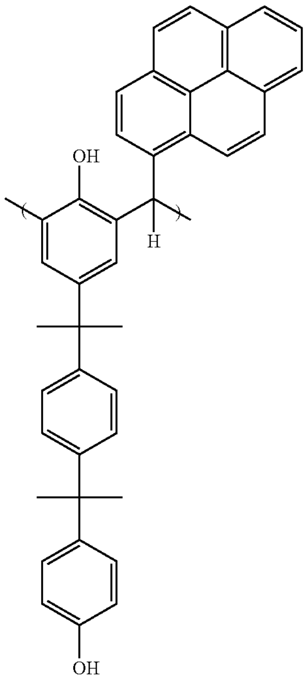
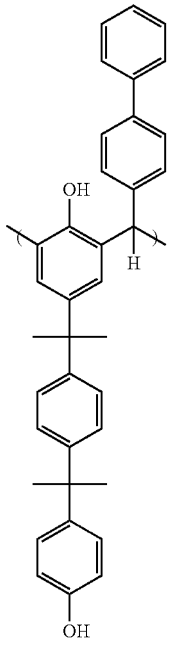
-continued
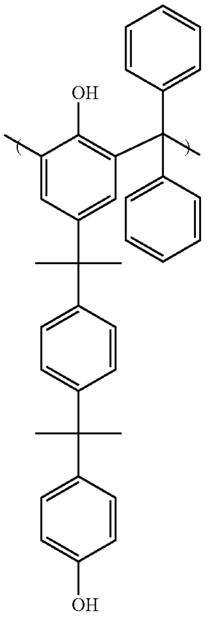
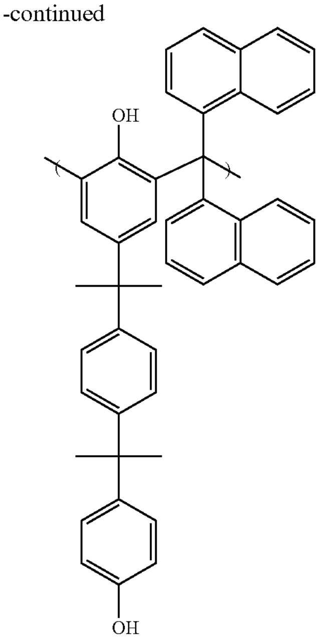
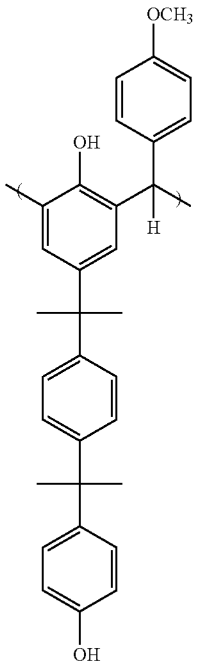
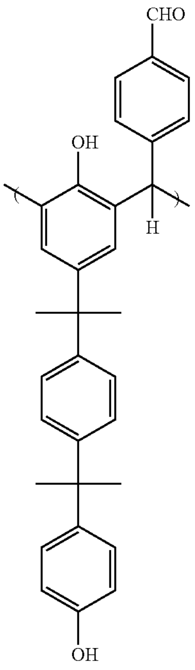

-continued

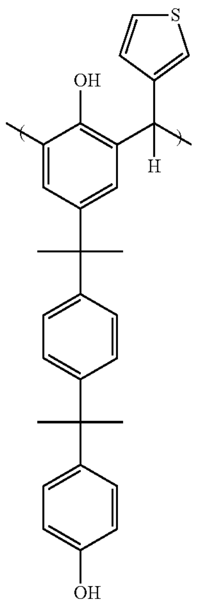

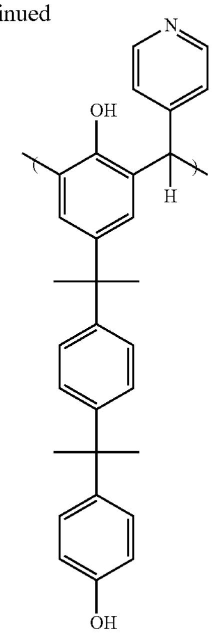

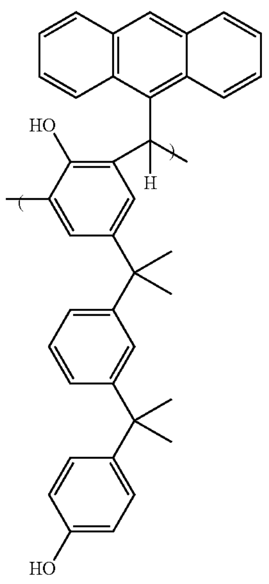

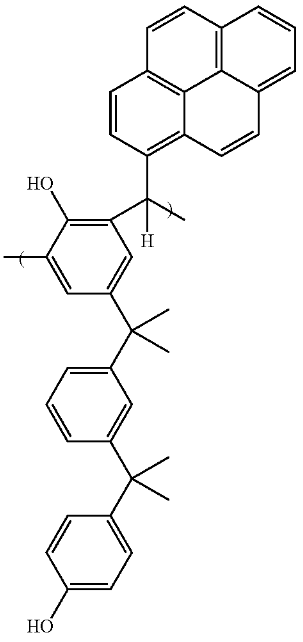

-continued

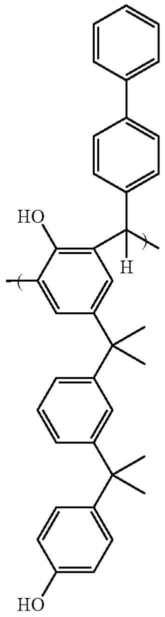

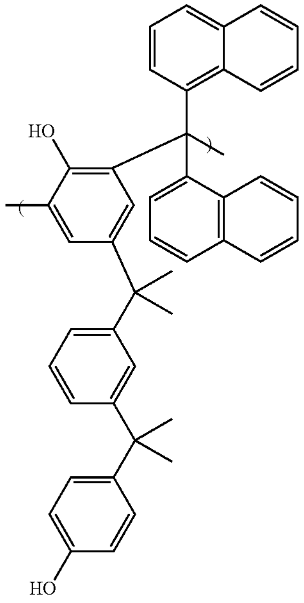

5. A resist underlayer film-forming composition containing a polymer, wherein the polymer is a novolak resin having a structure in which a formed novolak resin includes a polymer represented by the following formula (1a-3), and an addition unit having a group represented by the following formula (1) is bound to any of the rings of the formed novolak resin:

(1)

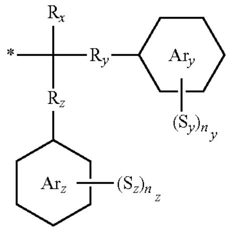

wherein each of $R_x$, $S_y$, and $S_z$ represents a hydrogen atom or a monovalent organic group that has 2 to 20 carbon atoms and optionally includes at least one of a nitrogen atom, an oxygen atom, and a sulfur atom, and comprises a cyclic skeleton having from 2 to 5 and 7 to 20 carbon atoms, a linear-chain skeleton, or a branched-chain skeleton;

each of $R_y$ and $R_z$ represents a single bond or a divalent organic group;

each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween;

$n_y$ is an integer of 0 to the maximum number corresponding to allowable substitution to ring $Ar_y$;

$n_z$ is an integer of 0 to the maximum number corresponding to allowable substitution to ring $Ar_z$; and

* is a novolak resin bonding site;

(1a-3)

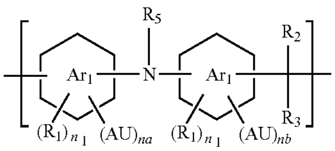

wherein each of AU represents a group represented by formula (1);

each of $R_1$ represents a halogen group, a nitro group, an amino group, a hydroxyl group, a C6 to C40 aromatic hydrocarbyl group, a C1 to C10 alkyl group, or a C2 to C10 alkenyl group, and may include at least one of an ether group, a ketone group, and an ester group;

$R_2$ represents a heterocyclic group or a C6 to C40 aromatic hydrocarbyl group, and the heterocyclic group or the aromatic hydrocarbyl group may have at least one substituent selected from among a halogen group, a nitro group, an amino group, a formyl group, a carboxyl group, a hydroxyl group, a C1 to C10 alkyl group, a C1 to C10 alkoxy group, and a C6 to C40 aryl group;

$R_3$ represents a hydrogen atom, a heterocyclic group, a C6 to C40 aromatic hydrocarbyl group, a C1 to C10 alkyl group, or a C2 to C10 alkenyl group, and the heterocyclic group, the aromatic hydrocarbyl group, the alkyl group, or the alkenyl group may have at least one substituent selected from among a halogen group, a nitro group, an amino group, and a hydroxyl group;

$R_2$ and $R_3$ may be linked together to form a ring structure;

$R_5$ represents at least one member selected from among a hydrogen atom, a C1 to C10 alkyl group, a C2 to C10 alkenyl group, and a C6 to C40 aryl group and may include at least one of an ether group, a ketone group, and an ester group;

each of ring $Ar_1$ represents a benzene ring or a naphthalene ring;

each of $n_1$ is an integer of 0 to 3;

the sum $n_a+n_b$ is independently an integer of ≥1; and each of the sum $n_a+n_1$ and the sum $n_b+n_1$ is an integer of 0 to the maximum number corresponding to allowable substitution to ring $Ar_1$.

6. A resist underlayer film-forming composition containing a polymer, wherein the polymer is a novolak resin having a structure in which a formed novolak resin includes a polymer represented by the following formula (1b-1), and an addition unit having a group represented by the following formula (1) is bound to any of the rings of the formed novolak resin:

(1)

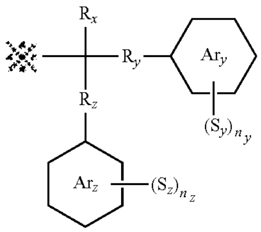

wherein each of $R_x$, $S_y$, and $S_z$ represents a hydrogen atom or a monovalent organic group that has 2 to 20 carbon atoms and optionally includes at least one of a nitrogen atom, an oxygen atom, and a sulfur atom, and comprises a cyclic skeleton having from 2 to 5 and 7 to 20 carbon atoms, a linear-chain skeleton, or a branched-chain skeleton;

each of $R_y$ and $R_z$ represents a single bond or a divalent organic group;

each of ring $Ar_y$ and ring $Ar_z$ represents a C4 to C20 cyclic alkyl group or a C6 to C30 aryl group, and ring $Ar_y$ and ring $Ar_z$ may be linked together to form a new ring structure therebetween;

$n_y$ is an integer of 0 to the maximum number corresponding to allowable substitution to ring $Ar_y$;

$n_z$ is an integer of 0 to the maximum number corresponding to allowable substitution to ring $Ar_z$; and

* is a novolak resin bonding site;

(1b-1)

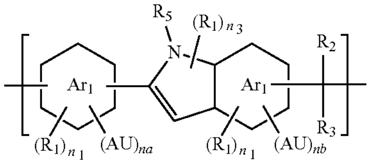

wherein each of AU represents a group represented by formula (1);

each of $R_1$ represents a halogen group, a nitro group, an amino group, a hydroxyl group, a C6 to C40 aromatic hydrocarbyl group, a C1 to C10 alkyl group, or a C2 to C10 alkenyl group, and may include at least one of an ether group, a ketone group, and an ester group;

$R_2$ represents a hydrogen atom, a heterocyclic group, or a C6 to C40 aromatic hydrocarbyl group;

the heterocyclic group or the aromatic hydrocarbyl group may have at least one substituent selected from among a halogen group, a nitro group, an amino group, a formyl group, a carboxyl group, an alkyl carboxylate ester group, a phenyl group, a hydroxyl group, a C1 to C10 alkoxy group, and a C6 to C40 aryl group;

$R_3$ represents a hydrogen atom, a heterocyclic group, a C6 to C40 aromatic hydrocarbyl group, or a C1 to C10 alkyl group;

$R_2$ and $R_3$ may be linked together to form a ring structure;

ring $Ar_1$ represents a benzene ring, a naphthalene ring, or an anthracene ring;

$R_5$ represents at least one member selected from among a hydrogen atom, a C1 to C10 alkyl group, a C2 to C10 alkenyl group, and a C6 to C40 aryl group and may include at least one of an ether group, a ketone group, and an ester group;

the sum $n_a+n_b$ is independently an integer of ≥1;

each of $n_1$ and $n_3$ is an integer of ≥0;

each of the sum $n_a+n_1$ and the sum $n_b+n_1$ is an integer of 0 to the maximum number corresponding to allowable substitution to ring $Ar_1$; and $n_3$ is an integer of 0 to the maximum number corresponding to allowable substitution to the $R_1$-bound heterocyclic ring.

7. The method for producing a patterned substrate, the method comprising a step of forming a resist underlayer film on a substrate by use of the resist underlayer film-forming composition as recited in claim 1;

a step of forming a specific hard mask on the resist underlayer film;

a step of forming a photoresist film on the hard mask;

a step of forming a resist pattern through light exposure to and development of the photoresist film;

a step of forming a mask pattern by etching the hard mask through the resist pattern;

a step of forming a resist underlayer pattern by etching the resist underlayer film through the mask pattern; and a step of processing the substrate through the resist underlayer pattern.

8. The method for producing a semiconductor device, the method comprising a step of applying, onto a substrate, the resist underlayer film-forming composition as recited in claim 1;

a step of etching the resist underlayer film through a specific pattern to form a patterned resist underlayer film, and a step of processing the substrate through the patterned resist underlayer film.

* * * * *